(12) United States Patent
Gavin et al.

(10) Patent No.: US 6,757,643 B2
(45) Date of Patent: *Jun. 29, 2004

(54) FABRICATION AND DESIGN OF STRUCTURAL MEMBERS

(75) Inventors: Peter Geoffrey Gavin, Napier (NZ); Peter Robert Brennan, Napier (NZ); Thomas William Ellis, Napier (NZ)

(73) Assignee: Nucon Steel Corporation, Denton, TX (US)

( * ) Notice: Subject to any disclaimer, the term of this patent is extended or adjusted under 35 U.S.C. 154(b) by 452 days.

This patent is subject to a terminal disclaimer.

(21) Appl. No.: 09/854,309

(22) Filed: May 11, 2001

(65) Prior Publication Data

US 2001/0044707 A1 Nov. 22, 2001

Related U.S. Application Data

(62) Division of application No. 09/306,082, filed on May 6, 1999, now Pat. No. 6,272,447.

(30) Foreign Application Priority Data

Dec. 21, 1995  (NZ) ................................................. 280737
Dec. 21, 1995  (NZ) ................................................. 280741
Oct. 21, 1998  (NZ) ................................................. 332446

(51) Int. Cl.[7] ............................................... G06F 17/50
(52) U.S. Cl. ............................... 703/1; 703/6; 700/97; 700/98; 700/118
(58) Field of Search ....................... 703/1, 6, 7; 700/97, 700/98, 118, 182; 706/919, 923; 345/964; 52/528, 748.1; 72/181; 707/104

(56) References Cited

U.S. PATENT DOCUMENTS 4,660,399 A   4/1987   Suter et al. .................... 72/181
4,858,146 A   8/1989   Shebini .......................... 703/1
5,033,014 A   7/1991   Carver et al. ................... 703/1

(List continued on next page.)

FOREIGN PATENT DOCUMENTS

| AU | 52665/93 | 12/1993 |
| AU | 52666/93 | 12/1993 |
| EP | 0 846 549 A2 | 12/1997 |
| GB | 2 279 594 A | 1/1995 |
| WO | WO 87/01977 | 4/1987 |
| WO | WO 96/35022 | 11/1996 |

OTHER PUBLICATIONS

Levy et al., *Feature–based Design Approach in the Sheet Metal Industry*, Proc. 4th Inter. Conf. Computer Integrated Man. And Tech., pp. 66–71, Oct. 1994.

Moradi et al., *Geometry–based Part Grouping for Assembly Planning*, Proc. Of the 1997 IEEE Inter. Symp. On Assembly and Task Planning, pp. 281–286, Aug. 1997.

(List continued on next page.)

*Primary Examiner*—Russell Frejd
(74) *Attorney, Agent, or Firm*—Moore & Van Allen PLLC; Dominic J. Chiantera

(57) ABSTRACT

A method of designing a building frame by a computer includes the building frame having a number of structural members of which at least some are intersecting structural members. On the computer is stored a predetermined plan of the layout and orientation of the structural members in the frame. This plan includes a design length for each of the structural members. A joint type is selected from a plurality of different joint types for each intersection of the intersecting structural members. The stored predetermined plan is then analysed to derive specifications of actual lengths and jointing details for the structural members to enable the structural members made according to specification to fit together to form the frame. The actual length for each intersecting structural member is variable from the design length depending on the selected joint types.

13 Claims, 25 Drawing Sheets

U.S. PATENT DOCUMENTS

| | | | |
|---|---|---|---|
| 5,526,628 A | 6/1996 | Knudson | 52/528 |
| 5,555,406 A | 9/1996 | Nozawa | 703/1 |
| 5,559,708 A | 9/1996 | Turnbull et al. | 700/97 |
| 5,627,763 A | 5/1997 | Carlson | 703/1 |
| 5,651,230 A | 7/1997 | Knudson | 52/748.1 |
| 5,689,435 A | 11/1997 | Umey et al. | 703/1 |
| 5,761,674 A | 6/1998 | Iti | 707/104 |
| 5,940,309 A | 8/1999 | White et al. | 703/7 |
| 5,983,010 A | 11/1999 | Murdock et al. | 703/6 |
| 6,014,503 A | 1/2000 | Nagata et al. | 703/1 |
| 6,272,447 B1 * | 8/2001 | Gavin et al. | 703/1 |

OTHER PUBLICATIONS

Radack et al., *Positioning Features within the Rapid Design System*, Systems Engineering, 1991, IEEE International Conference on, 1991, pp. 38–41, Aug. 1991.

Liu et al., *CAD–Based Automated Mechinable Feature Extraction*, 27$^{th}$ ASILOMAR Conference on Signals, Systems and Computers, vol. 1, pp. 558–562, Nov. 1993.

Horvath et al., *Generation of Manufacturing Process Model Entities*, Inter. Conf. On Intelligent Processing Systems, vol. 1, pp. 824–828, Oct. 1997.

Lazaro et al., *Automated Design of Maching Fixtures: Tolerance and Dequential Operations*, Intelligent Systems Engineering, vol. 1, Issue 2, pp. 172–184, Winter 1992.

Hoffmann et al., *A Road Map to Solid Modeling*, IEEE Trans. On Visualization and computer Graphics, vol. 2, No. 1, pp. 3–10, Mar. 1996.

Werkman et al., *Design fabricator Interpreter System: Evaluating Alternative Connection Configurations*, Sixth Conference on Artificial Intelligence for Applications, vol. 1, pp. 153–159, May 1990.

Werkman, K.J., *Negotiation in DAI as an Infrastructure Component for Collaborative Enterprises*, Proc. Second Workshop on Enabling Tech: Infra. For Collaborative Enterprises, pp. 104–117, Apr. 1993.

* cited by examiner

Wall frame design detail - gcad3

FABRICATION AND DESIGN OF STRUCTURAL MEMBERS

CROSS-REFERENCE TO RELATED APPLICATIONS

This application is a divisional of U.S. patent application Ser. No. 09/306,082, filed May 6, 1999, now U.S. Pat. No. 6,272,447, entitled FABRICATION AND DESIGN OF STRUCTURAL MEMBERS which claims priority to New Zealand Application No. 332,446, filed Oct. 21, 1998, which applications are hereby incorporated by reference.

BACKGROUND OF THE INVENTION

1. The Field of the Invention

The present invention generally relates to design and fabrication of structural members. In particular, although not exclusively, the invention relates to roll forming of structural members from light gauge steel in a substantially automated manner from the drafting table to the construction site.

2. The Relevant Technology

A difficulty with conventional building construction is that assembly of the various elements requires skilled labor. The construction process generally involves preparing the structural members on site prior to assembly. In the case of timber, such preparation may involve complex joint shapes to be cut into the timber before joining through the use of machine tools requiring the expertise of a skilled operator. With extruded or roll formed materials, such materials still require joining features to be added subsequent to their production. Assembly also involves general engineering skill such as plan reading to follow the architect's intended plan. The skilled labor required increases building costs and the degree of skill required means that errors may be made in carrying out the architect's intended plan.

The design process also requires considerable professional skill including sound engineering knowledge and proficiency with the various codes of practice enforced by the authorities. The professional costs also add considerably to the cost of building.

It will also be appreciated that the transport and delivery of materials to a site adds to the cost of building. Inconvenience and delays will result if materials are not available when required. Preformed, precut and preassembled materials may reduce onsite labor costs but generally need to be well organized so that pieces are not lost or confused.

Another difficulty with conventional building is the huge range of materials required to be transported to a building site. This imposes storage problems as well as the difficulty of coordinating all the required materials to complete a particular job. Any materials on the building site are also liable to theft.

It is therefore an object of the present invention to devise ways of overcoming or at least ameliorating the above-mentioned disadvantages.

BRIEF SUMMARY OF THE INVENTION

In accordance with a first aspect of the present invention, there is provided, a method of fabricating structural members for a building frame according to predetermined specifications of length and connecting features for jointing which enable the structural members to be assembled as a building frame, the method including the steps of: forming the members on a forming machine, the forming machine also creating the connecting features.

The connecting features formed by the forming machine may include holes for fasteners to join the structural members and/or notches shaped to receive intersecting structural members. In a preferred form of the invention, the structural members formed by the forming machine have a web and two arms defining a U-section, with inward strengthening folds at the outer edge of each arm, the connecting features formed by the forming machine including flattened edge portions created by forming back portions of the strengthening folds to at least the plane of the associated arm.

Advantageously, the structural members are formed from steel sheet of approximately 0.55 mm in thickness. However, metal sheet of any thickness may be used. Aluminium alloys may also be used.

In accordance with a second aspect of the present invention there is provided, a method of fabricating a building frame from structural members having respective predetermined specifications of length and connecting features required for jointing, the length and the connecting features being such that the structural members can be assembled to form the frame, the method including the steps of: forming the members to the specifications of length on a forming machine, wherein the forming machine also creating the connecting features; and assembling members to form the frame.

Preferably, the connecting features formed by the forming machine include holes for fasteners to join the structural members and/or notches. Preferably, the structural members formed by the forming machine have a web and two arms defining a U-section, with inward strengthening folds at the outer edge of each arm, the connecting features formed by the forming machine including flattened edge portions created by forming back portions of the strengthening folds to at least the plane of the associated arm.

Desirably, the assembly step is carried out without further substantial modification of the structural members.

The structural members for the frame may be formed with a common section. Preferably, the structural members are formed on the forming machine in an order enabling each member after the first, to be assembled with the previous member(s). Suitably, the structural members are formed consecutively by the forming machine with more than one structural member being formed substantially simultaneously by the forming machine In a preferred form of the invention, the structural members are formed from steel sheet of approximately 0.55 mm in thickness. However, other metals of other thicknesses are envisaged.

In accordance with a third aspect of the present invention there is provided, a method of designing, by a computer, a building frame having a number of structural members, the method including the steps of: inputting a predetermined plan of the layout and orientation of the structural members in the frame; storing the predetermined plan in a memory means; analysing the stored predetermined plan to provide a specification of length and jointing details for each structural member to enable the structural members made according to specification to fit together to form the frame; and outputting the specifications of each structural member.

Each of the structural members in the plan may be modelled as a basic element and the analysis of the stored predetermined plan may be conducted by converting the basic elements to 3-dimensional section shapes according to the orientation prescribed by the plan. Then, by spatial analysis, section lengths may be calculated, which enable the structural members to fit together. The 3-dimensional section shape may be predefined.

In a preferred form of the method set out above as the third aspect, the method includes inputting a hole locus relative to a section locus, the jointing details for each structural member including holes aligned with holes on an intersecting structural member, the location of each hole being calculated by ascertaining the intersection of the hole locus on one structural member with the hole locus on an intersecting structural member. Preferably, the method is conducted on a forming machine for forming the structural members, and the hole locus is input from feedback provided by the forming machine.

In accordance with a fourth aspect of the present invention there is provided, a method of fabricating a building frame including the following steps: designing, on a computer, the building frame according to the third aspect described above; forming the structural members on a forming machine according to the outputted specifications; and assembling the structural members according to the predetermined plan.

The structural members may be formed with a common section.

The method set out above as the fourth aspect may further include the step of controlling, by computer, the operations of the forming machine, that being the same computer as the computer used for designing the building frame. Advantageously, the structural members are formed on the site where the structural members are assembled. The structural members may be formed by the use of a portable roll forming machine.

In accordance with a fifth aspect of the present invention there is provided, a method of constructing framework for a building, including the steps of: designing the layout of frames defining the building; designing a plan of the layout and orientation of structural members for the frames; analysing the plan to provide a specification of length and jointing details for each structural member to enable the structural members made according to specification to be joined together; creating one or more computer data files of specifications; forming the structural members on a forming machine according to the specifications contained in the computer data file(s); and assembling the formed structural members according to the plan.

Preferably, the structural members have a common section. The method set out above may include the step of controlling, by computer, the operations of the forming machine, that computer also being used for the step of analysing to provide the specifications. In a preferred embodiment of the invention, the structural members are formed on the site where the structural members are assembled. In a most preferred form of the invention, the structural members are formed by the use of a portable roll forming machine.

In accordance with a sixth aspect of the present invention there is provided, a forming machine to fabricate structural members for a building frame, the forming machine including memory means to store structural member specifications of length and connecting features for jointing which enable the structural members to be assembled as a building frame, wherein the forming machine is adapted to form each structural member according to the length specification and create the connecting features according to specification.

Advantageously, the forming machine further includes a computer having: a program with: input means to input a predetermined plan of the layout and orientation of the structural members in the frame; and an analysis engine for deriving the specifications of lengths and jointing details from the predetermined plan. The computer may include the memory means and the computer may be programmed to provide operational control to the forming machine. The forming machine may include rollers to form the structural members from sheet metal.

In accordance with a seventh aspect of the present invention there is provided, a computer program for designing a building frame having a number of structural members including: input means for inputting a predetermined plan of the layout and orientation of each of the structural members in the frame; analysis engine for deriving, from the predetermined plan, a specification of lengths and jointing details to enable structural members made according to specification to fit together to form the frame; and output means for outputting the specifications.

Preferably, each of the structural members in the plan is modelled as a basic element and the analysis engine is programmed to convert the basic elements to 3-dimensional section shapes according to the orientation prescribed by the plan and further, to conduct spatial analysis to calculate section lengths which enable the structural members to fit together.

Parameters of the 3-dimensional section shapes may be provided in the programming. The program may further include parameter input means for user input of the variable parameters of the 3-dimensional section shapes. The analysis engine may programmed to convert the basic elements to a common 3-dimensional section shape.

Advantageously, the program further includes locus input means to input a hole locus relative to a section locus, the jointing details for each structural member including holes aligned with holes on an intersecting structural member, the analysis engine being programmed to calculate the location of each hole by ascertaining the intersection of the hole locus on one structural member with the hole locus on an intersecting structural member.

This invention may also be said broadly to consist in the parts, elements and features referred to or indicated in the specification of the application, individually or collectively, and any or all combinations of any two or more of said parts, elements or features, and where specific integers are mentioned herein which have known equivalents in the art to which this invention relates, such known equivalents are deemed to be incorporated herein as if individually set forth.

The invention consists in the foregoing and also envisages constructions of which the following gives examples.

BRIEF DESCRIPTION OF THE DRAWINGS

In order that the invention may be more fully understood, one preferred form of the present invention will now be described with reference to the accompanying drawings in which:

FIG. 1b is a plan view of the structural member illustrated in FIG. 1a;

FIG. 1c is a side view of the structural member illustrated in FIG. 1a;

FIG. 2a is a perspective view of the structural member illustrated in FIG. 1a;

FIG. 2b illustrates a first type of joint between two structural members of the type illustrated in FIG. 1a;

FIG. 2c illustrates a second type of joint between two structural members of the type illustrated in FIG. 2a;

DETAILED DESCRIPTION OF THE PREFERRED EMBODIMENTS

Structural Members

Figure 1A:
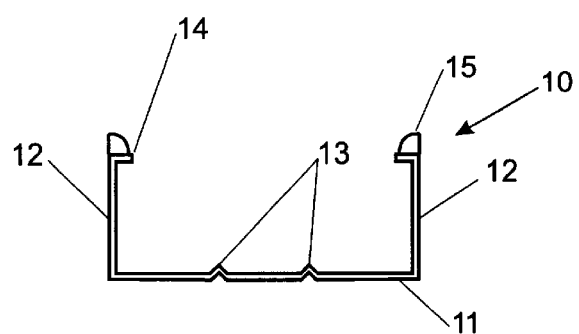
FIG. 1a is a cross-sectional view of a steel structural member used in buildings constructed in accordance with a preferred embodiment of the present invention.

FIG. 1 illustrates the form of the structural members which are used to make up building 10 frames constructed in accordance with the present invention. Structural members of this form are used to make up various wall frames, ceiling frames, roof frames and roof support frames. Generally, rivets are used to join the structural members to form the various frames. Once assembled, all of the frames for a particular building are assembled on a building slab and secured in position to the slab and to each other. The finished frame may then be clad internally with plasterboard or externally with conventional cladding in the conventional manner.

U.S. patent application Ser. No. 09/251,375, filed Feb. 17, 1999, concerns a new building construction and a new methodology for building construction using light gauge steels with reference to the section illustrated in FIG. 1. Moreover, that application concerns building frame design that uses the same steel section for substantially all of the structural members in substantially all of the structural frames that combine to make up the framework of the building. The details of that application are incorporated herein by reference.

The present invention enables the design and production processes for the frames for such buildings to be substantially automated, although it will be understood that the present invention is not limited to production of the buildings described in application Ser. No. 09/251,375. While the invention is not limited to using the same steel section throughout any particular design, it will be understood that certain advantages accrue from using the same steel section throughout a building project. It will be understood that the supply and handling of a single steel section for all of the structural members is simpler than using varied structural sections. However, the advantages are particularly manifest when on-site production of the structural members is achieved.

In the present invention, on-site production is realized by the use of a single portable roll forming machine. This further simplifies the handling of material for the structural members since all of the structural members can be produced on site from coils of steel sheet. This eliminates the need to bundle and carry lengths of steel section. Moreover, the production of the structural members is achieved. In the present invention, on-site production is realised by the use of a single portable roll forming machine. This further simplifies the handling of material for the structural members since all of the structural members can be produced on site from coils of steel sheet. This eliminates the need to bundle and carry lengths of steel section.

Moreover, the production of the structural members on site eliminates the need to sort the structural members and avoids any confusion as to the precise location of each structural member. Further benefits are realised by the use of light gauge steel section. By "light gauge" or "light weight", steel section of approximately 0.55 mm in thickness is intended, although section between 0.4 and 0.7 may be included within the definition. Light gauge steel is easier to work with than heavier gauge steels of say 1.2 mm, commonly used in the building industry.

The structural member 10 (illustrated in FIGS. 1a to 1c) is a channel having a web 11 and arms 12 in a squared U-section. The member illustrated is not necessarily realistic in its arrangement of particular features but serves to demonstrate those features in a compact fashion. In the member 10, web 11 is seen to have a pair of strengthening ribs 13 which are spaced from each other and extend in the lengthwise direction of the web 11. The arms 12 each have a strengthening fold in the form of a lip 14 turned inwards to the channel.

Flattened edge portions 15 of the strengthening folds 14 are formed back to the plane of the arms 12. These flattened edged portions 15 are disposed on opposite sides of the member 10 to enable another structural member to be accommodated within the channel to thereby form a joint between the two members. A joint of this type is illustrated in FIG. 2c where the structural member 25 is inserted into the channel of structural member 26. One of the flattened edge portions 15 of the structural member 26 can be viewed in FIG. 2c. Joints of this type are required when junctions between two intersecting members have one member 25 to be inserted into the open channel of another member 26.

Figure 2A:
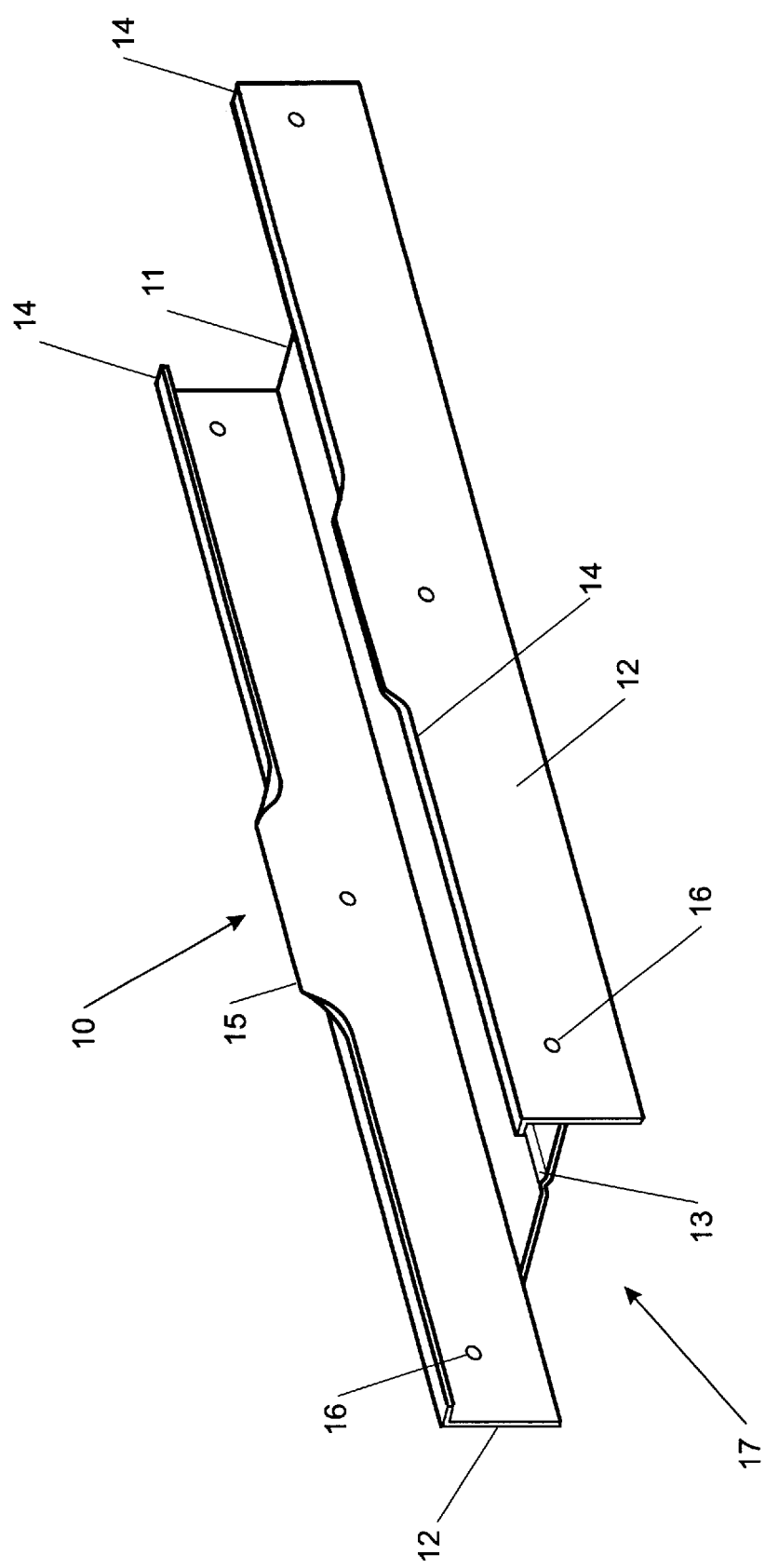
Figure 2B:
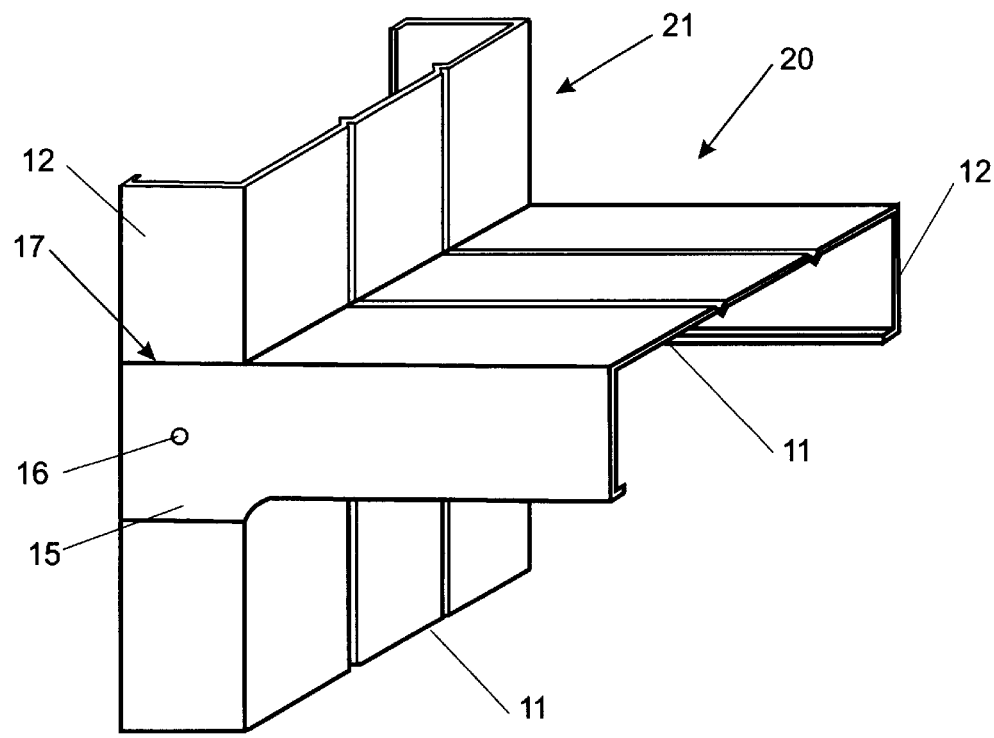
Figure 2C:
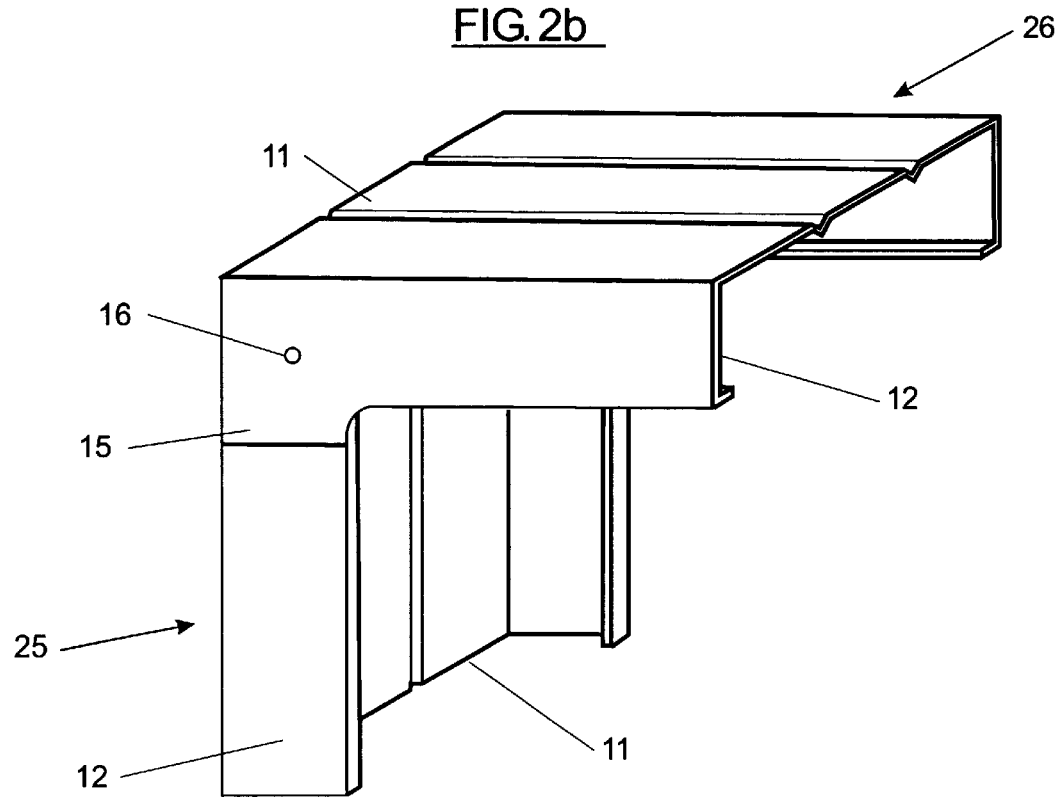

Another type of junction is illustrated in FIG. 2b. Whereas the junction illustrated in FIG. 2c is of the type where one structural 25 can be inserted into the channel of the other structural member 26, the junction illustrated in FIG. 2b is of an alternative type whereby the member extending through the intersection has the open side of the channel facing away from the other member. A notch 17 is created in structural member 20 in order to receive the structural member 21. The structural member 20 also has flattened edge portions 15 in the vicinity of the junction to facilitate the insertion of the structural member 21 within the notch 17 of structural member 20.

Either of the above types of junctions may be used in the frames constructed from the structural member 10 illustrated in FIGS. 1a–2a. The joints between intersecting structural members are secured by rivets and for this purpose aligned holes 16 are punched or drilled through the structural members 10, 25, 26, 20, 21.

Figure 16:
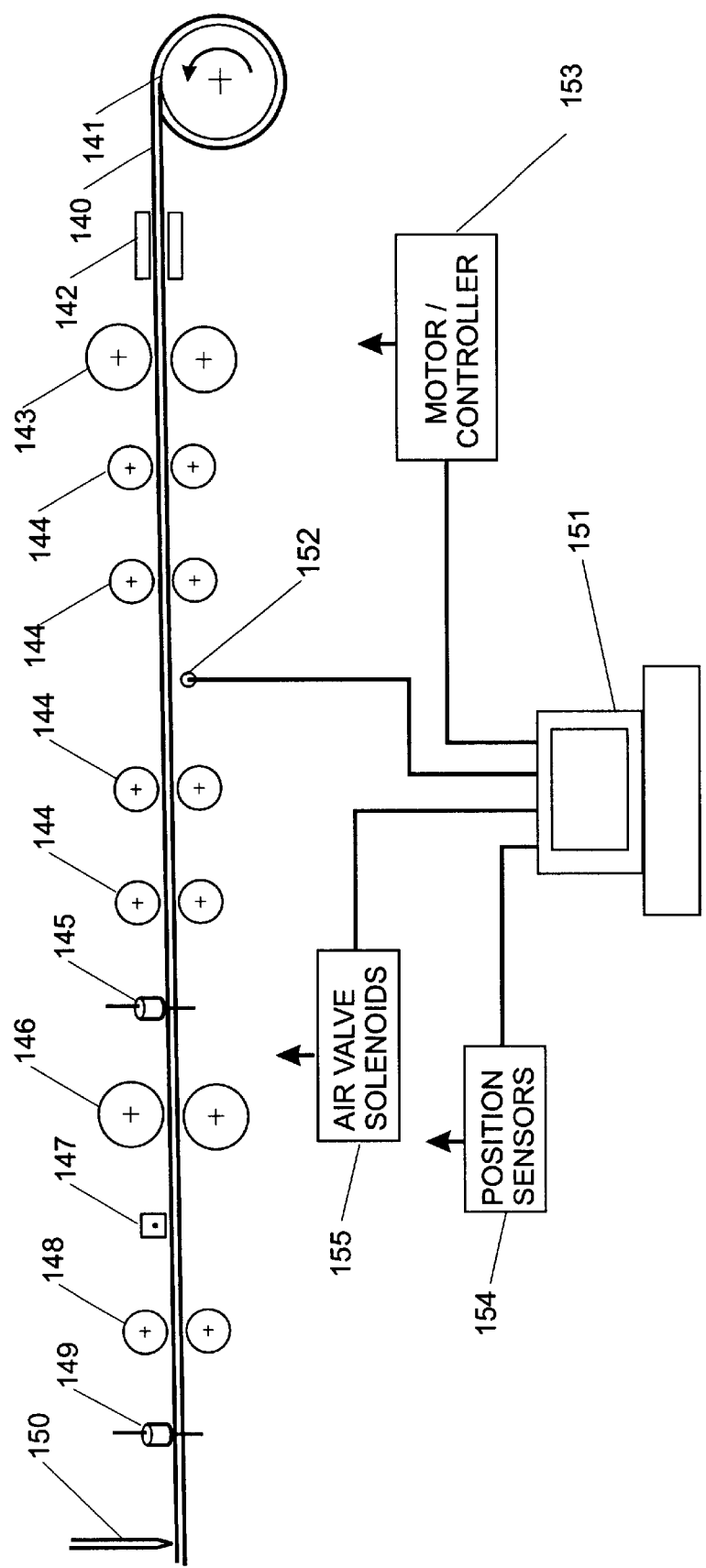
FIG. 16 is a schematic view of a roll forming machine.

Additionally, service holes (not shown) may be provided in the structural members 10, 25, 26, 20, 21 to accommodate electrical wiring or other utilities. As will be explained subsequently, the roll forming machine illustrated in FIG. 16 is computer programmed and controlled to produce the structural members for a frame according to a predetermined plan. In other words, the structural members will be generated to an appropriate length with notches 17 and/or flattened edge portions 15, holes 16 positioned to align with holes on mating structural members and with service holes appropriately positioned.

Overview

Figure 3:
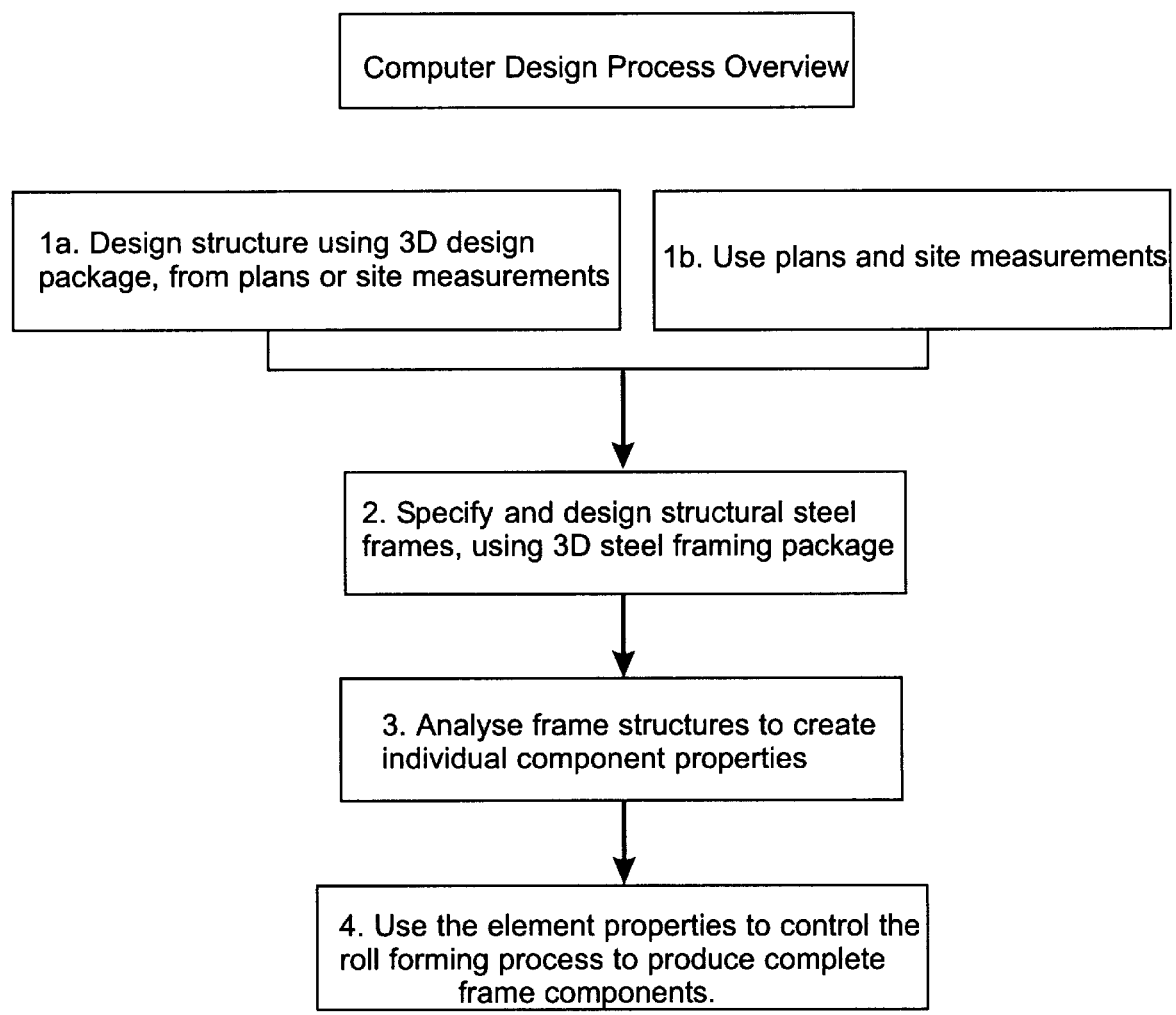
FIG. 3 is a flowchart providing an overview of the computer design process from architectural design through to production of the structural members.

FIG. 3 provides an overview of the process of building construction from the "design table" to the production of the structural members of the frame by the roll forming machine. Initially, the building is designed resulting in a 3-dimensional computer model indicating the various design features and shapes including floor plan with internal/external wall placement, window and door location and sizing, roof design including the various roof surfaces. The 3-dimensional model may be produced using any known commercial modelling software such as computer-aided drafting software. One such commercial computer-aided design package is Chief (TM) Automated House Design Software produced by Art Inc. of the United States. However, the invention is not limited to the use of this software package. While the computer-aided design software produces a model of the various design features, this software does not design the various structural members required to make up the frames of the building. This is the function of frame design software the subject of this application.

Figure 4:
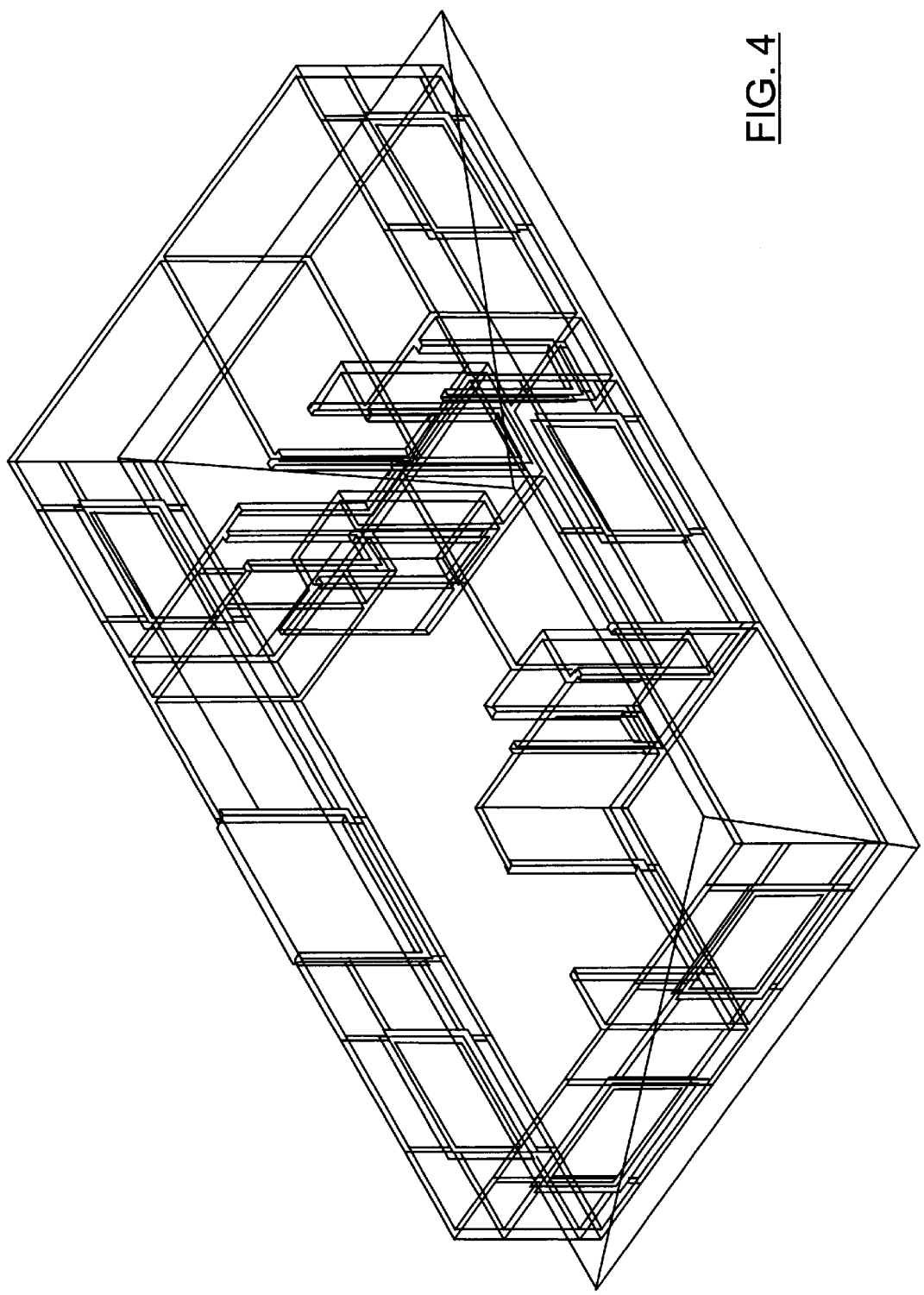
FIG. 4 is a perspective view of plans of a building, illustrating the typical output from a computer-aided drafting program.
Figure 5:
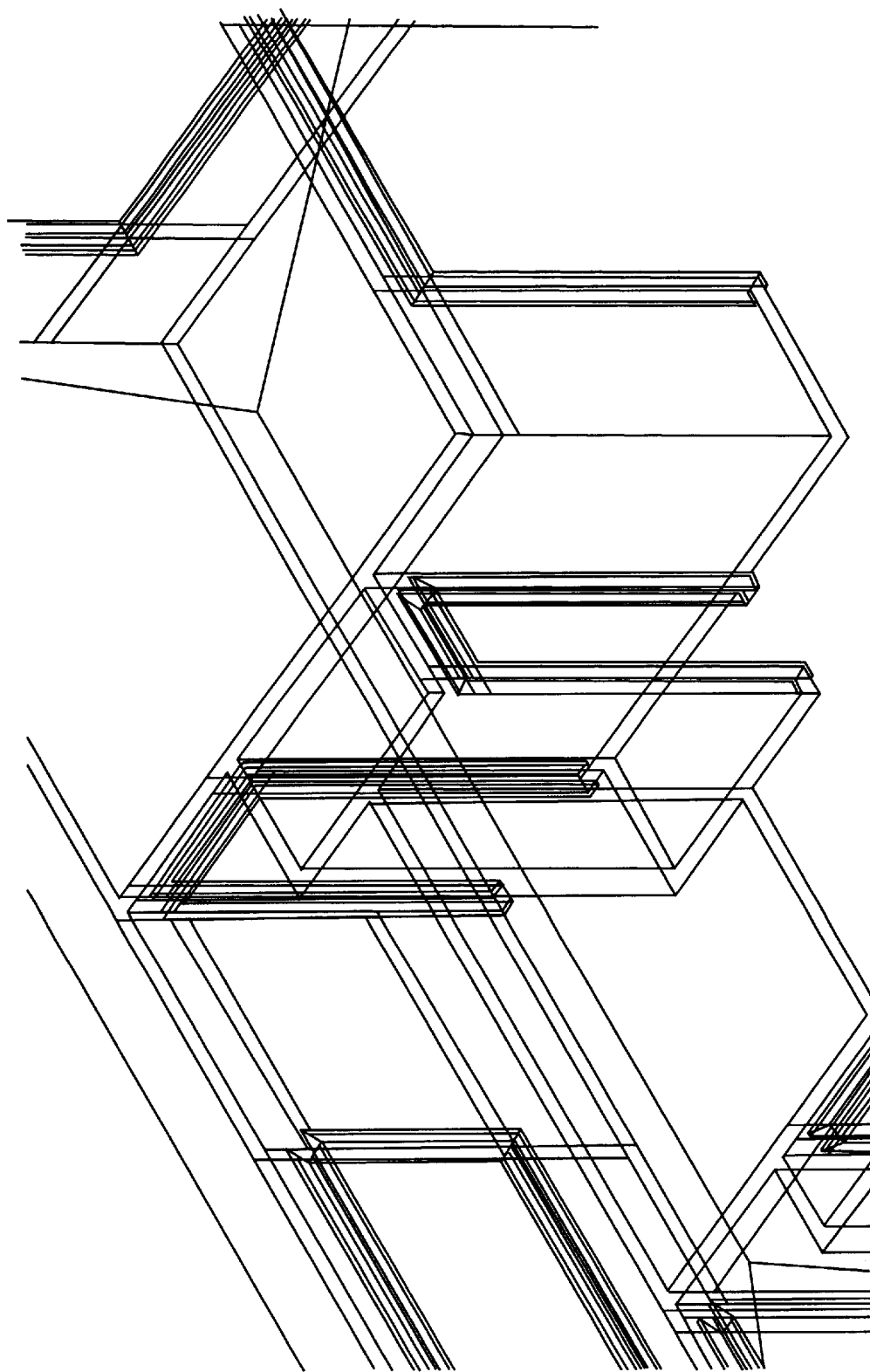
FIG. 5 is a perspective view of certain detail from FIG. 4.
Figure 6:
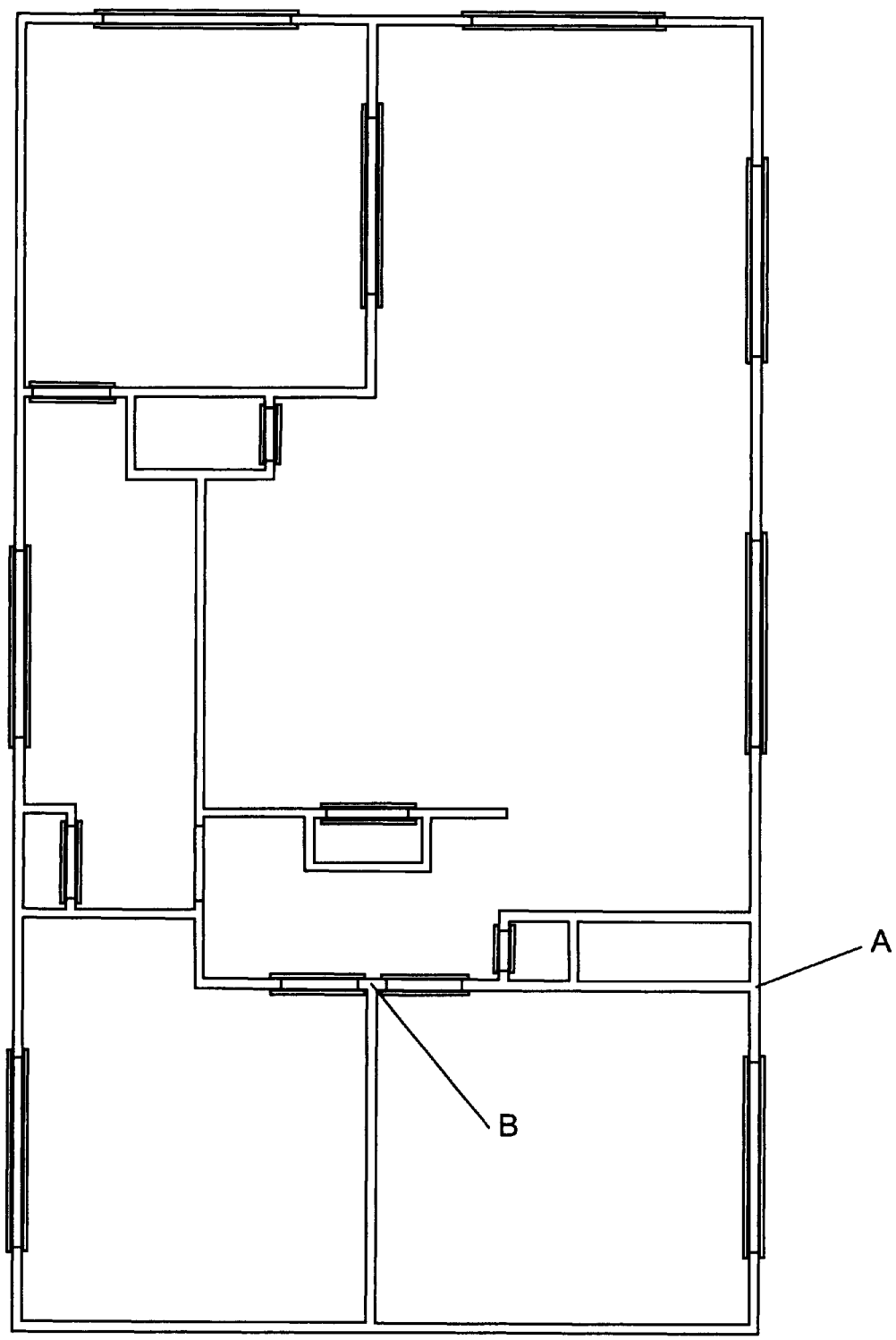
FIG. 6 is a plan view of the building illustrated in FIG. 4.
Figure 7:
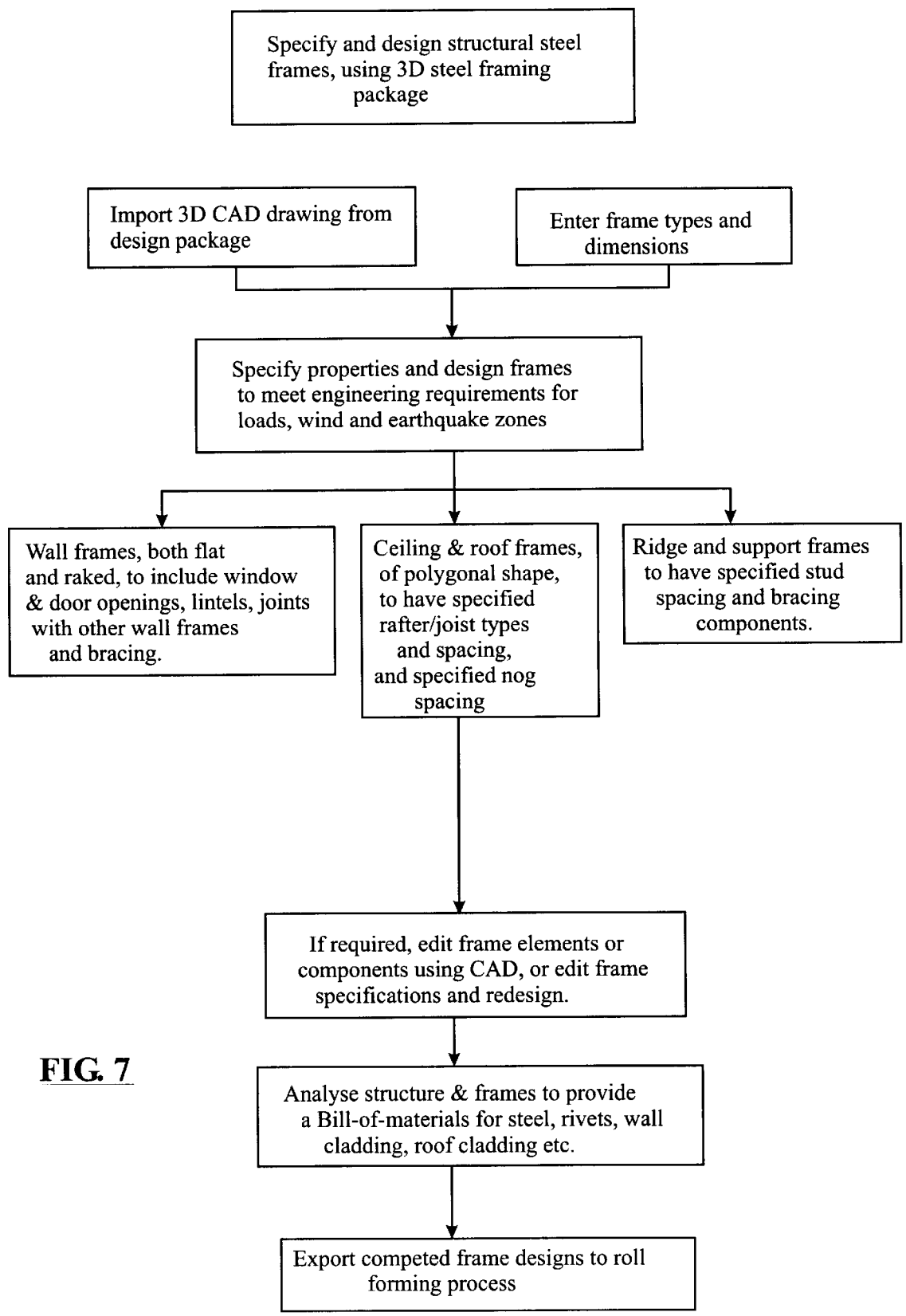
FIGS. 7A–7H are flowcharts illustrating the computer design process for the steel frames.

The views shown in FIGS. 4 to 6 are typical of the output produced by computer-aided drafting software. The industry standard output protocol of computer-aided drafting software is a .dxf file comprising simply information in the form of a series of lines/planes (which serves to indicate their length, placement and so forth). The function of the frame design software (as indicated by step 2 of the flowchart in FIG. 3) is to analyse the various lines and produce a plan of each frame required to construct the building. This will be described in more detail in connection with FIGS. 7 and 8.

In step 3 of the process, the member design software designs each of the structural members according to the plan developed by the frame design software. As will be explained more clearly in connection with FIGS. 11 to 14, the member design software determines the cut length, the placement of the rivet holes 16 and service holes, the location of flattened edge portions 15 and the location of notches 17. This information is used to produce the structural members on the roll forming machine (FIG. 16).

The use of light gauge steel means the structural members can be easily formed and cut as required. As previously mentioned, the roll forming machine is computer controlled and the machine will therefore produce the structural members precisely according to the specifications determined by the member design software. In view of the fact that the structural members are produced according to specification, the structural members can be assembled immediately without any subsequent forming operations.

Further, as the structural members have been produced with light gauge steel section, the junctions between the structural members may be achieved by simply inserting one structural member within the other. The use of light gauge steels allows a degree of deformation of either or both of the members to allow one to be accommodated within the other. Furthermore, as the notch 17, flattened portions 15 and rivet hole positions 16 have been accurately calculated, the structural members can be simply fitted and riveted together without the need for special framing jigs to hold the structural members in position while holes are drilled.

The frames may be assembled with the use of simple freestanding rests which are movable as required to a convenient location to hold the structural members at a convenient height above the ground to enable riveting of the frame members together. Because the frames are so light, once assembled by a worker at ground level, they can be manually lifted into position and secured to the slab or each other as required.

Frame Design Software

Figure 7A:
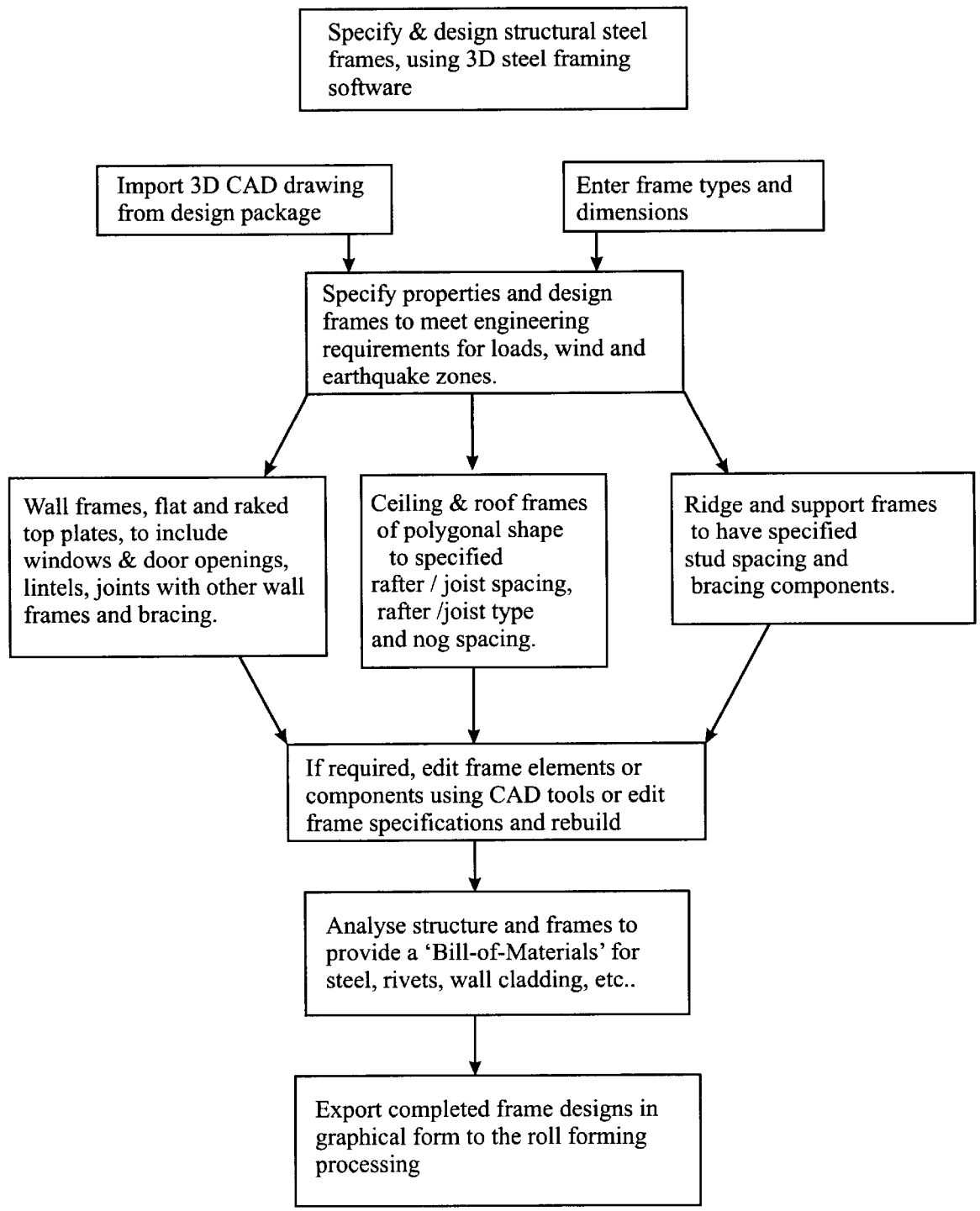

FIG. 7A illustrates the operation of the frame design software. As previously mentioned, the output protocol of computer-aided drafting software is a .dxf file comprising simply information in the form of simply a series of lines or planes. Alternatively, the information concerning the frame types and dimensions may be entered into the frame design software package by the user. Such information would indicate the frame type, e.g., wall frame together with its dimensions and the dimensions of openings such as door or windows and joint positions/sizes.

The challenge for the frame design software is to discriminate between lines which indicate that the extent of a particular frame, e.g., a line which indicates the base of a wall frame and those lines which carry information relating to other features in the wall. For example it can be seen from FIG. 4 that lines indicating a window opening extend beyond the opening and to the edge of the particular wall panel. It is the task of the frame design software to disregard these lines except at the boundary of the window or door opening. It achieves this task by considering as a whole, the intersecting lines which might relate to an opening, and if an opening is determined, establishing the location of the opening and determining those line relating to the boundary of the opening and disregarding those portions of the lines beyond the opening. The portions of each frame beyond any detected openings will then form a space in which structural members of the frame may be placed according to engineering requirements and other design criteria which will be explained below.

Figure 7B:
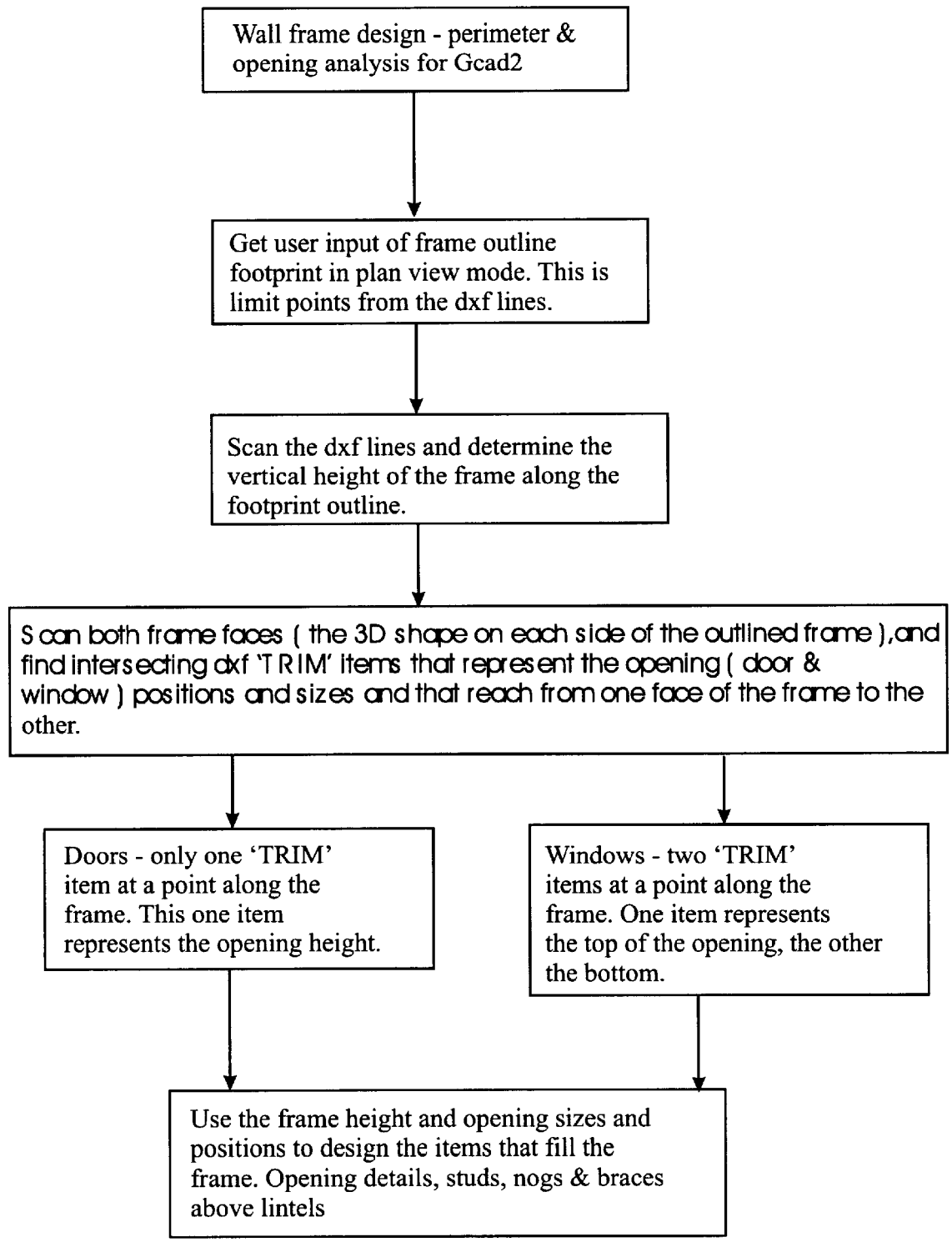
Figure 7C:
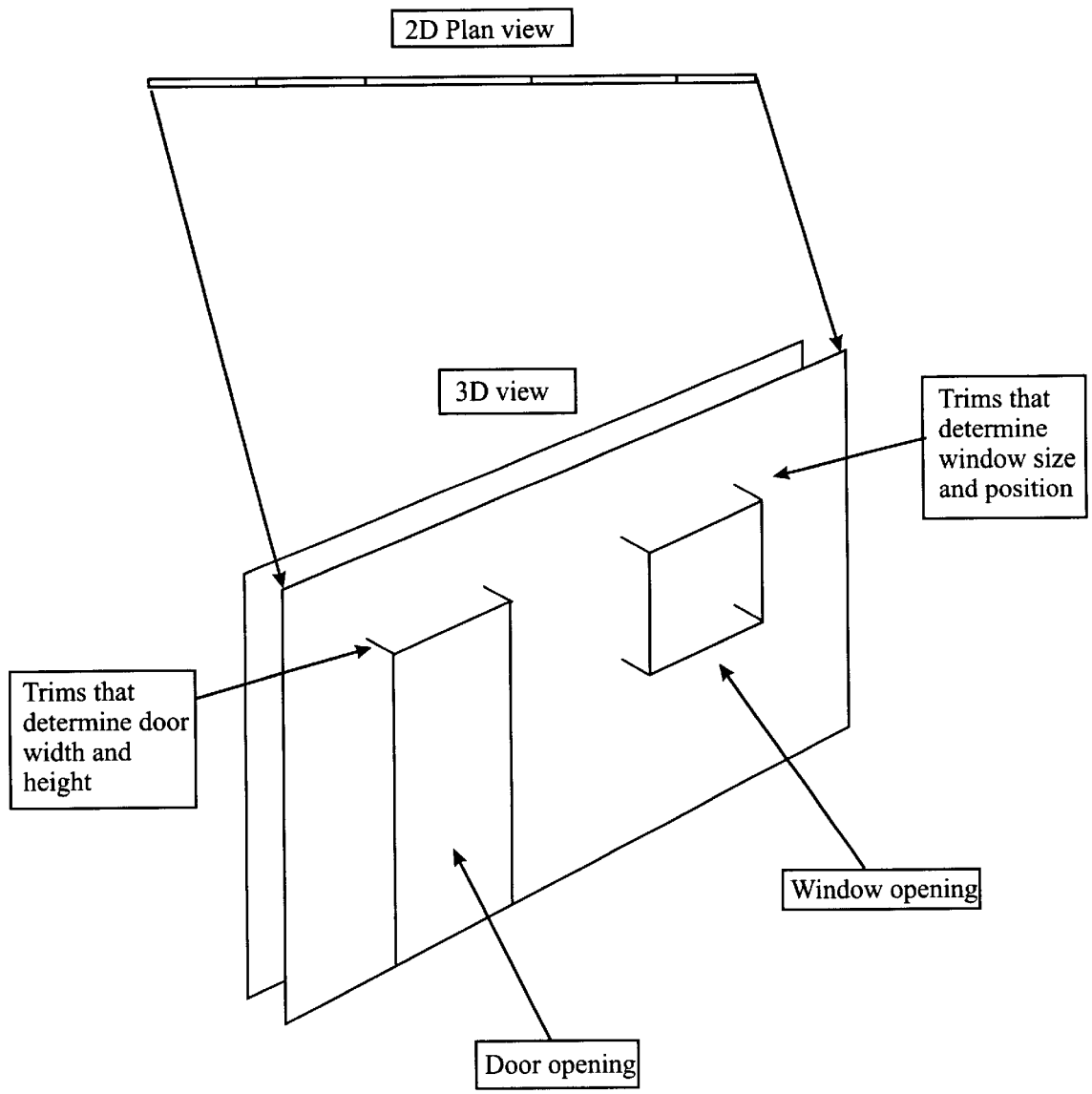

FIGS. 7B to 7H illustrate more particularly the procedure utilised by the frame design software for scanning and interpreting the .dxf lines. FIG. 7B illustrates a first preferred procedure for scanning and interpreting .dxf lines relating the wall frames. In this procedure, as shown in FIG. 7C, the wall frames are presented on the computer screen in two dimensional format. The wall frames are each represented with two side faces or planes.

As indicated in the flowchart, the user selects a particular wall frame for analysis using a mouse or similar computer pointing tool to indicate the endpoints of the frame as shown in the two dimensional view. The program then determines the height of the frames by determining the length of the .dxf lines at the user input endpoints of the wall frame. From the three dimensional view of the wall frame shown in FIG. 7C shown for the convenience of the reader, it can be appreciated that for each window and door opening, a number of trim lines extend between the two faces or planes of the frame.

The frame design software scans both of the faces to determine the presence of such trim lines. A trim line corresponding to a door opening will be determined where there is only one such trim line on the frame at that point in the two dimensional view. The level of this trim line determines the height of the door. As can be seen from FIG. 7C, for each window, when a trim line is detected, there will be two such trim lines on the wall frame at that particular point when considered from the two dimensional view. At each such point, one trim line will be at the level of the top of the window and the other will be at the bottom.

It can be seen from the flow chart in FIG. 7A that the frame design software can also accommodate wall frames of any of various shapes including rectangular and irregular polygons such as those that would be encountered in wall frames terminating in raked ceilings. The frame design software does this by analysing the lines from the .dxf file. In any wall being analysed, the first line encountered from the bottom will indicate the base of the wall whereas the last line encountered will indicate the top of the wall.

As indicated in FIG. 7A, the frame design software also enables user input of defined parameters in order that the frame design software will design frames to meet engineering requirements, e.g., for loads, to meet building codes in general and building codes for high wind and earthquake zones. For example the user has the option of inputting a maximum stud spacing. Additionally, the user can input whether a wall frame is load bearing or non-load bearing which will effect frame design. For instance, load bearing wall designs provide for structural lintels whereas non-load bearing wall designs do not provide structural lintels. Additionally, the user can indicate the type of cladding to be applied to the wall frame. The type of cladding can influence the frame design, in particular, stud placement as will be appreciated by a person skilled in the field of building.

Once the boundaries of the wall frame perimeter and openings have been determined, the frame design software designs the wall frames by taking into account engineering requirements and codes, user inputted parameters, window and door openings as previously explained, the particular type of lintel required, joints with other wall frames and any required bracing to produce the fully designed wall frame.

Figure 7D:
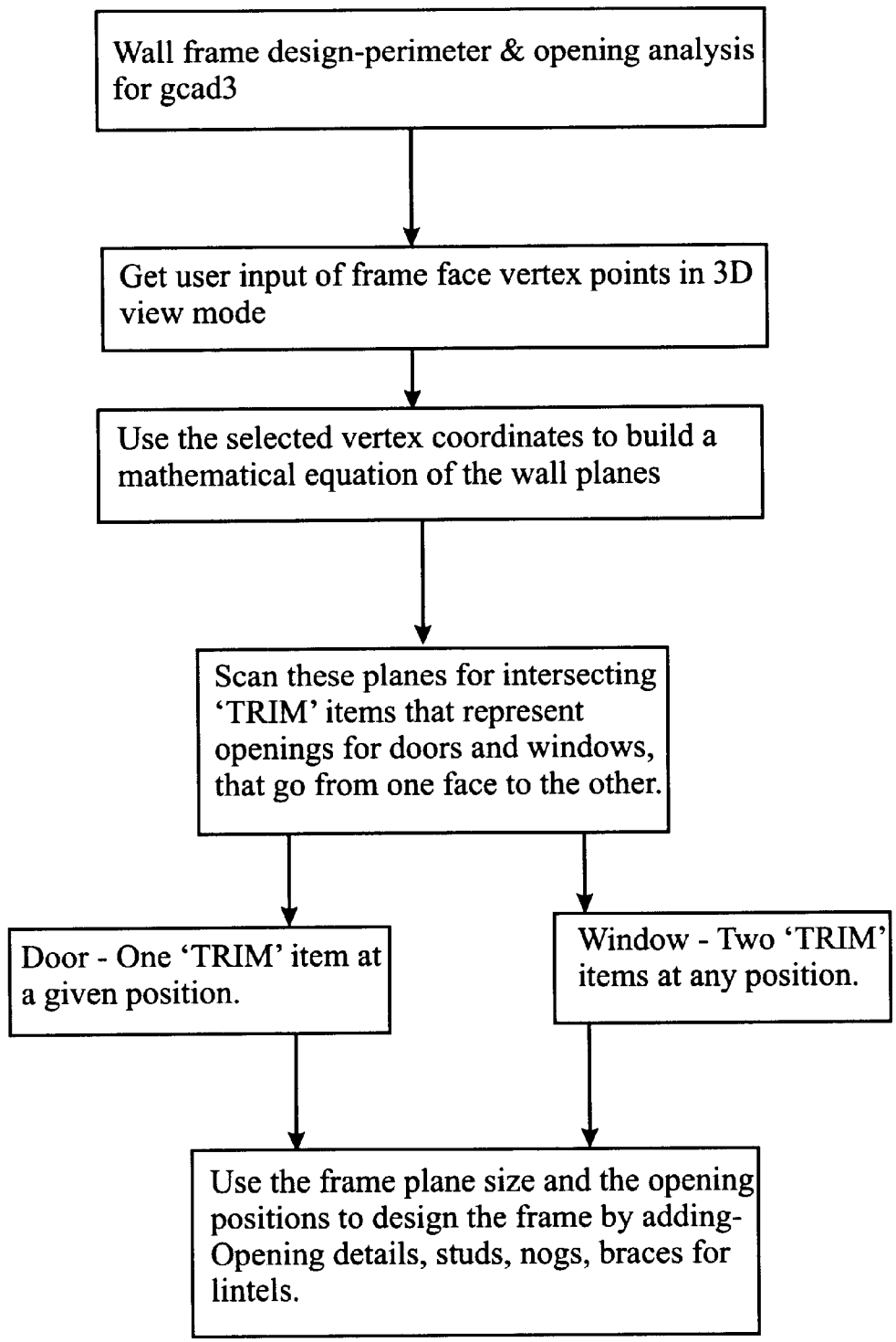
Figure 7E:
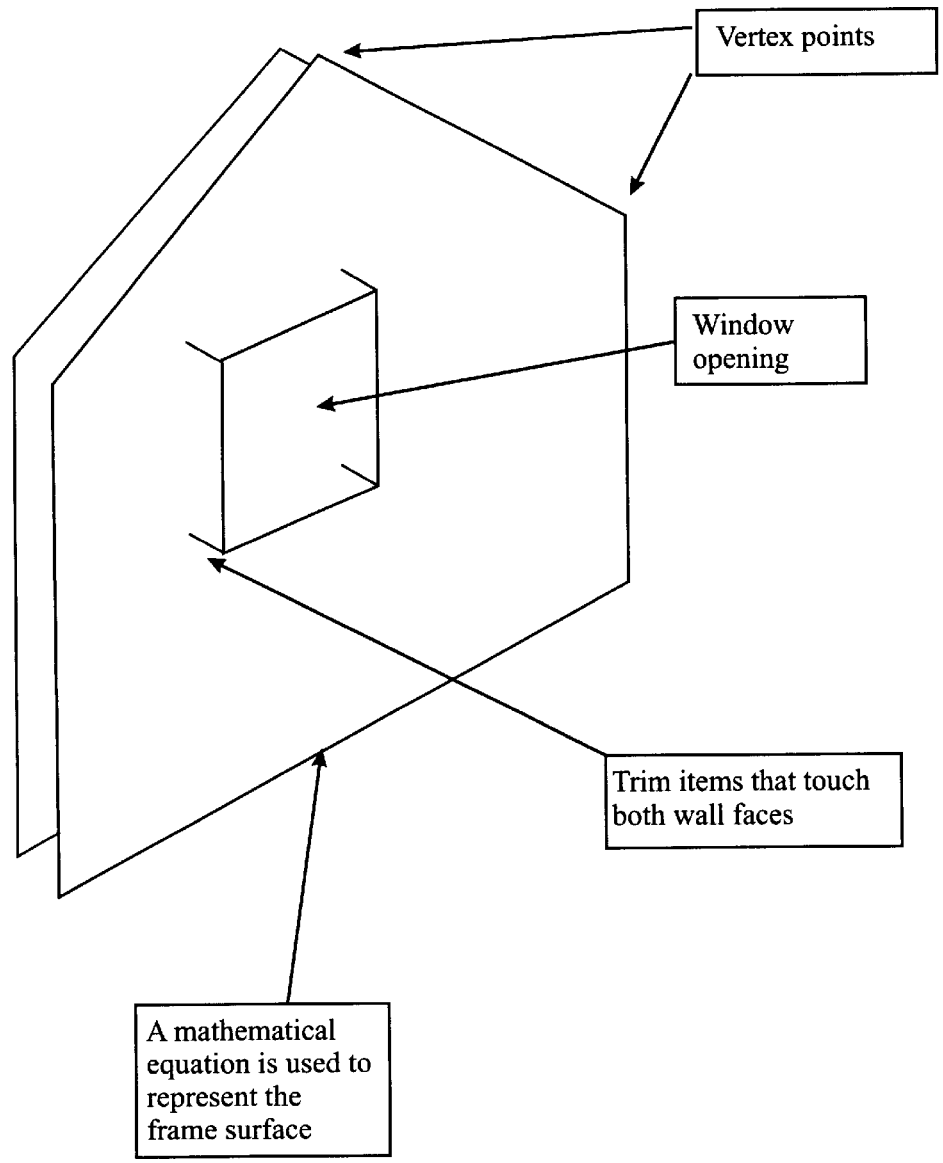

FIG. 7D illustrates an alternative procedure used by the frame design software for analysis of the .dxf lines to determine the perimeter and opening boundaries. In this modified procedure, the .dxf lines are presented from a three dimensional perspective and the user indicates the boundaries of the wall frame on this perspective view. The frame design software then builds a mathematical model of the wall planes. The wall planes are then scanned for intersecting trim lines. The trim line information is then used to determine opening boundaries as before. The frame design software then proceeds to design the frames as previously explained.

Figure 7F:
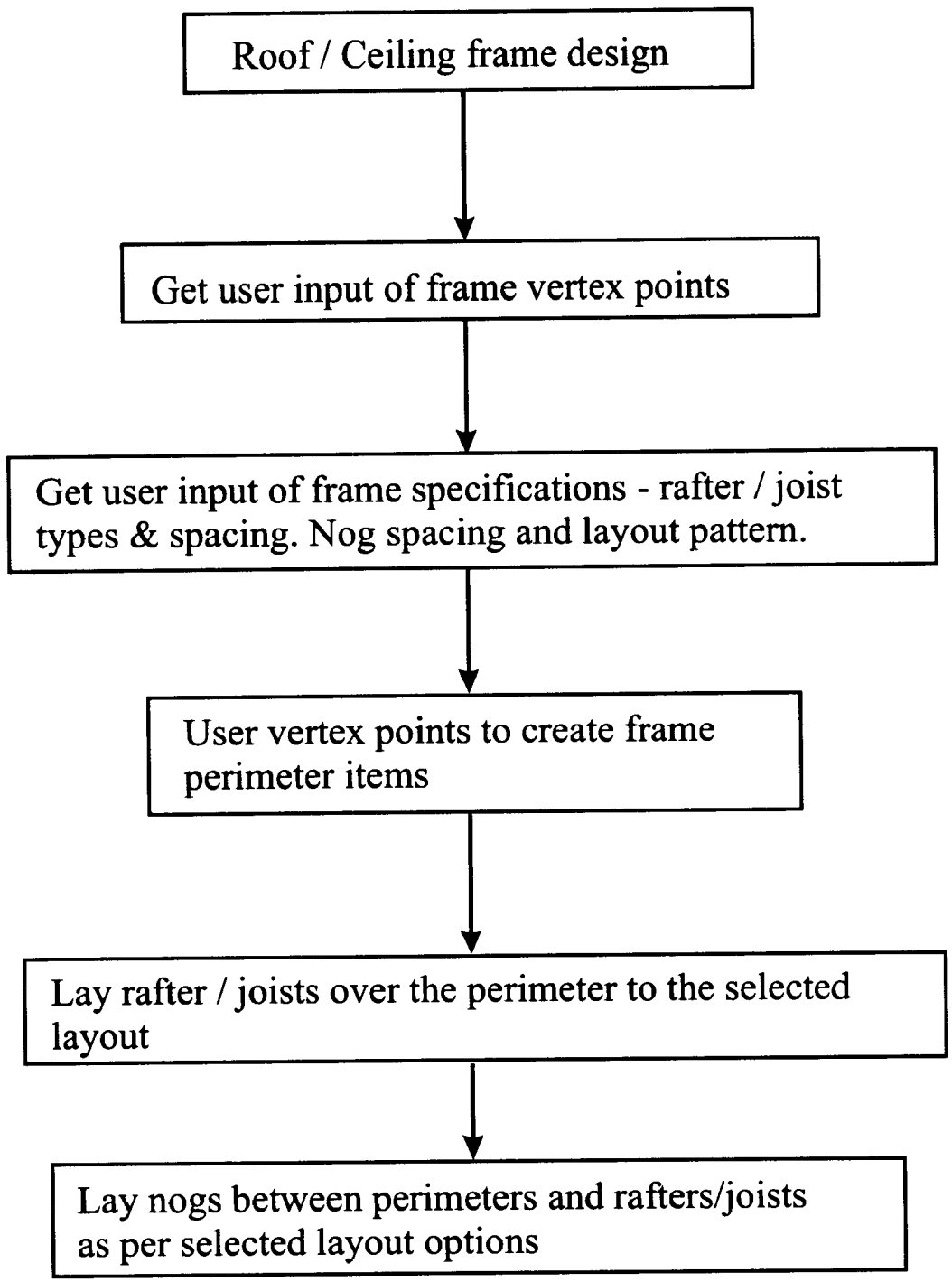

Ceiling frames are designed in a manner consistent with either of the two methods described above. FIG. 7F is a flowchart of the procedure. As before, the user inputs the vertex points of the ceiling frame. Ceiling frames can be designed with user input to specify the joist type and spacing. For example, two steel channels arranged back to back may be assembled to provide additional joist strength in the ceiling frame, particularly to enable a worker to walk on the ceiling frame during construction. The short members extending between adjacent joists and perpendicular to the joists are referred to as "nogs". The program also enables user input of the spacing between nogs in a direction parallel to the joists.

Similarly, roof frames which are supported above the ceiling frames to lie parallel to the various planes of the roof surface can also be generated in any of various polygonal shapes. The rafter spacing may be user specified and the nog spacing may also be user specified.

In U.S. patent application Ser. No. 09/251,375 ridge and intermediate support frames have been developed to support the roof frames in their inclined orientation above the ceiling frames. Specifically, the ridge frame extends the length of the roof ridge whereas intermediate support frames may be provided extending parallel to the ridge frame on either side of the ridge frame to provide intermediate support for the roof frames. Their general configuration comprises planar frames having spaced upright studs with diagonal bracing extending between adjacent upright studs. Again, a degree of user input as to the stud spacing and the bracing components is envisaged.

Figure 7G:
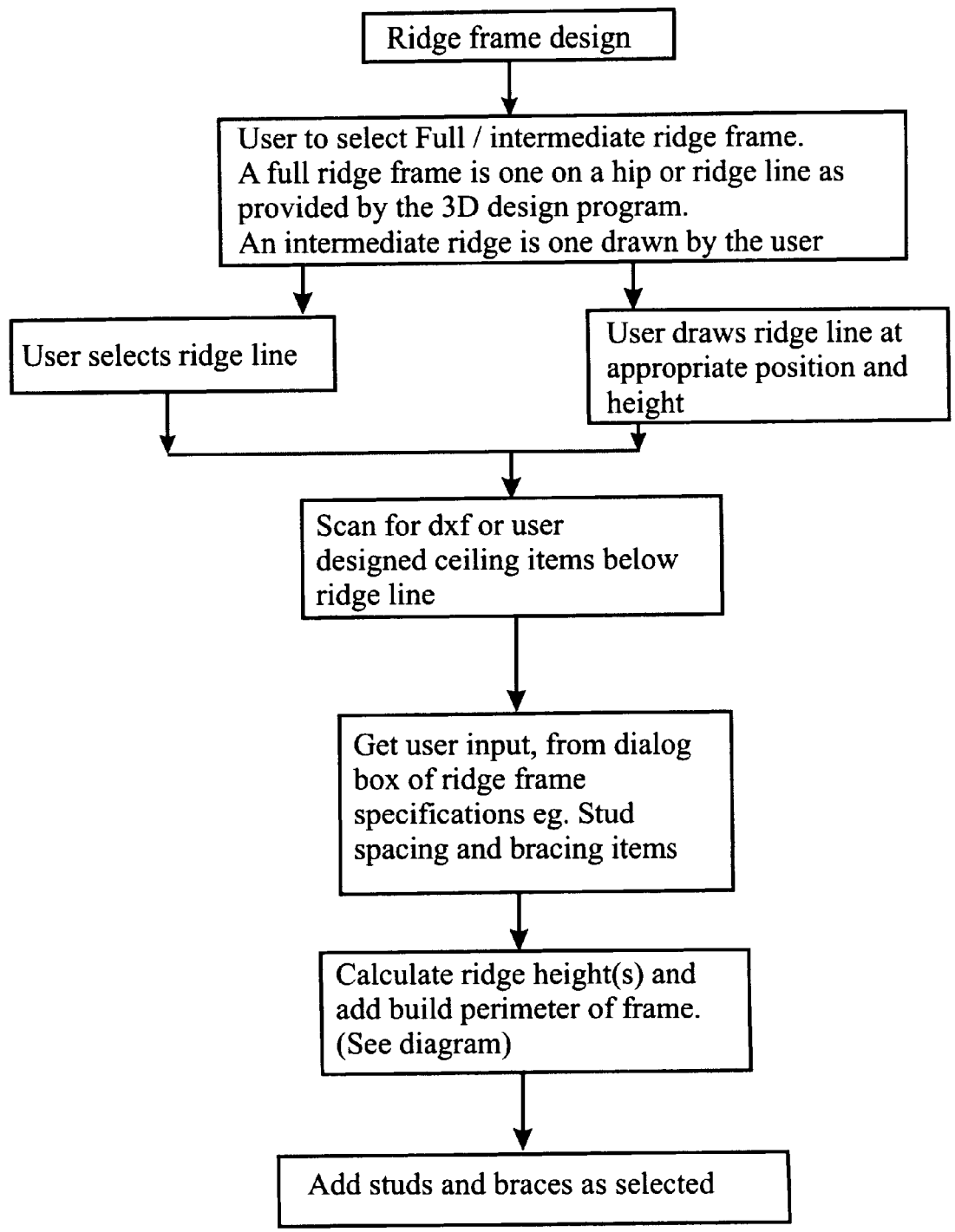
Figure 7H:
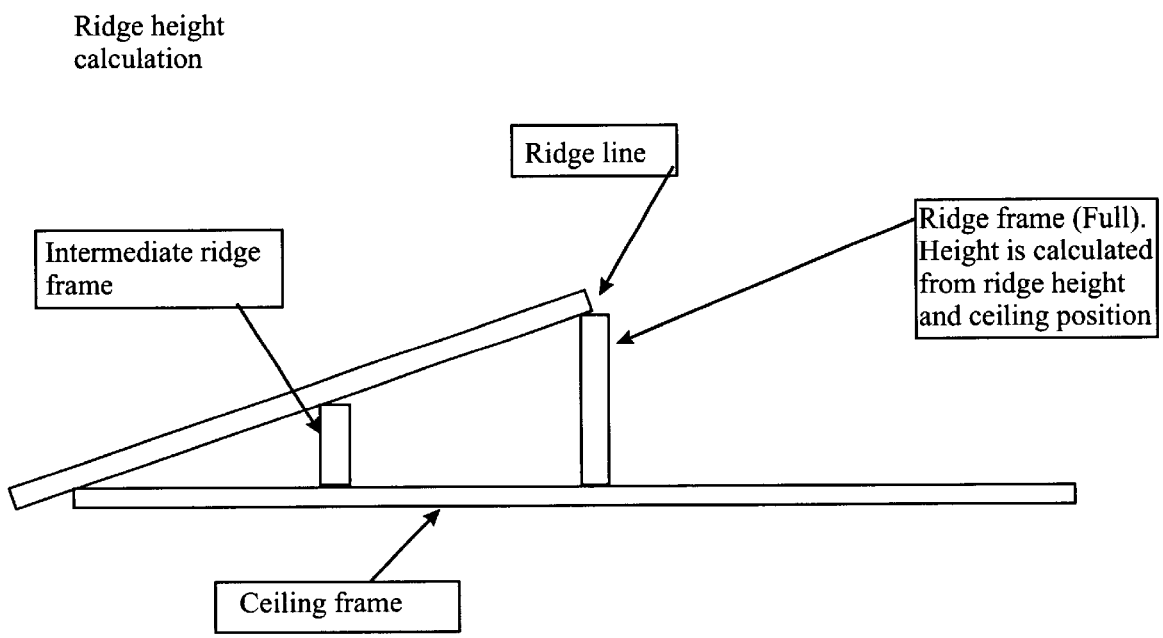

FIGS. 7G and 7H illustrate the procedure for designing the ridge frames or the intermediate support frames. The user inputs the location of the ridge frame line. In the case of a ridge frame, i.e., one on a hip or ridge line, the user merely indicates the location of the ridge line. For an intermediate support frame, the user draws a line at an appropriate location along the plan of the roof as indicated in FIG. 7H. The frame design software then scans for ceiling elements either the .dxf line pertaining to the ceiling frames below, or where the ceiling frame has already been designed, the designed ceiling frame. Again, the frame design software allows for user input of maximum stud spacing and bracing items. The height of the intermediate frames or the ridges frames are determined as per the diagram in FIG. 7H.

Once the various frames have been designed to meet engineering requirements, the frame design software enables the frames to be displayed and an editing function is provided for the user to change the frame plans or completely redesign. The display of the planned frames also enables the user to check for any obvious errors in design.

As indicated in FIG. 7A, the program also analyses the frame designs to provide quantity information as to the amount of steel, joining rivets, wall cladding and roof cladding to enable the building to be constructed. Given the completed 3-dimensional structure, the program could also perform a load analysis of the structure to ensure the engineering specifications have been met.

Figure 11:
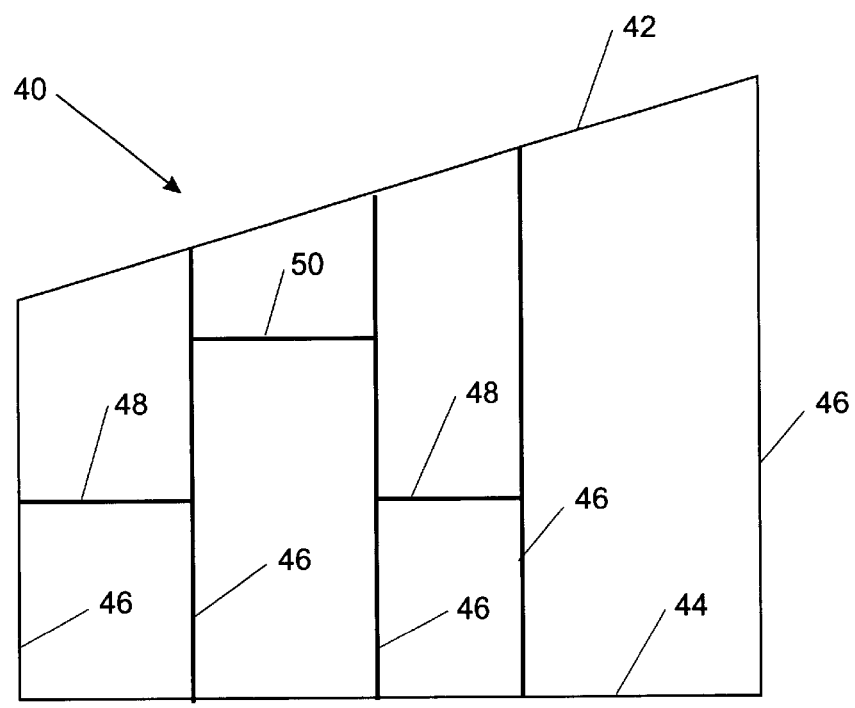
FIG. 11 is a side view of a wall frame.

The design generated by the frame design software is then exported into the member design software for design of the individual components which will be explained in connection with FIGS. 11 to 13.

Figure 8:
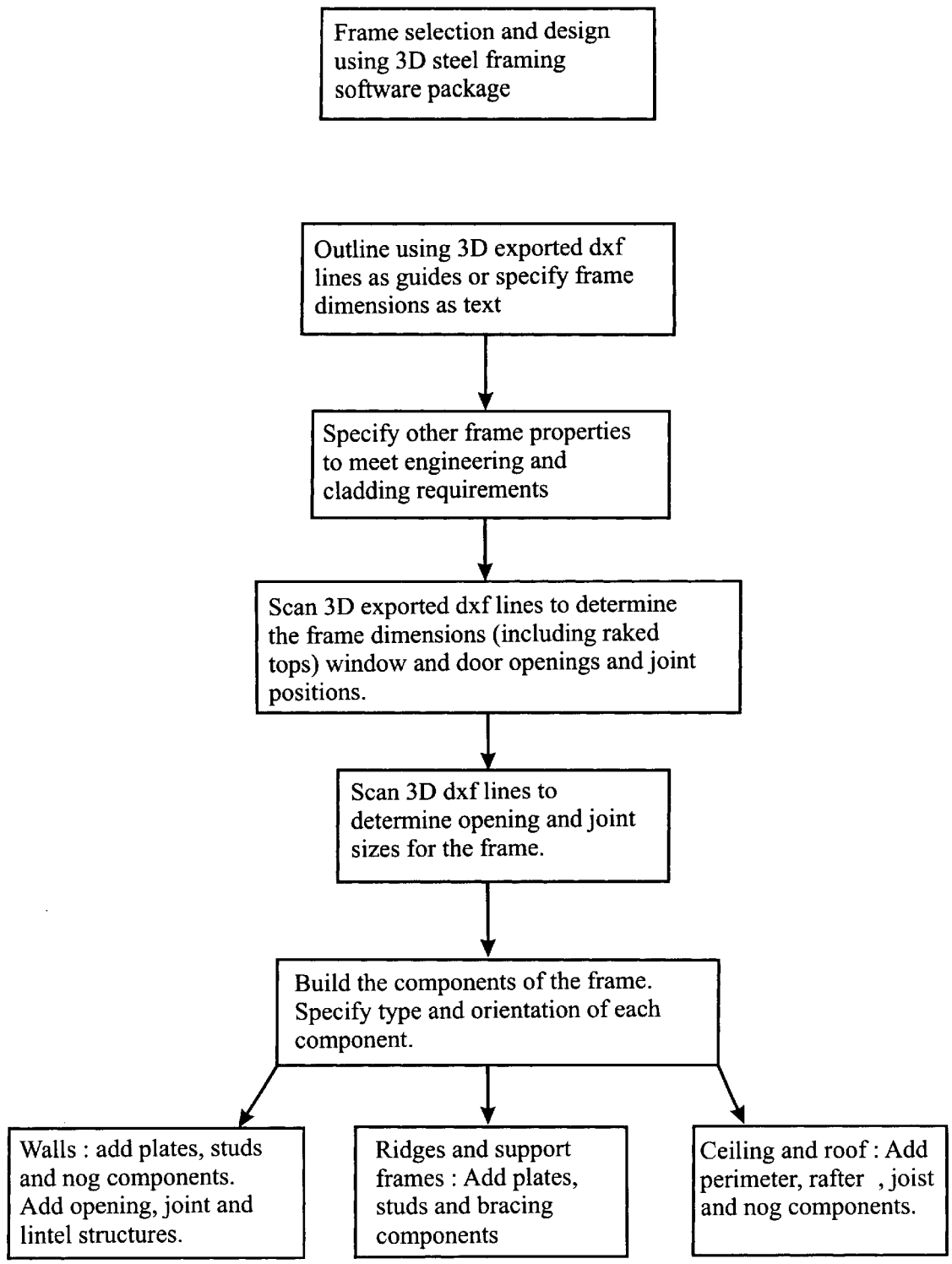
FIG. 8 is a more detailed flowchart of the computer design process for the steel frames.

The user operation of the frame design software will now be described in connection with the flow chart illustrated in FIG. 8. The user initially selects a particular frame outline from the plan view of the building design imported from the computer aided drafting software. For example, on the house plan illustrated in FIG. 6, the user selects the two end points of the wall A and B as indicated in FIG. 6. The user then labels this wall for future reference, e.g., W1. Alternatively, the frame design software may be used without the benefit of computer aided drafting software and the user may simply draw the frame outline from the plan and site measurements.

Having identified and labelled the wall, the user accesses the wall frame design menu whereby the program asks the user to specify frame properties, e.g., stud spacing. The type of cladding may also be input by the user as mentioned previously.

The frame design software scans the three dimensional .dxf lines to determine the overall frame size. For example, the programme can distinguish between the various lines to determine the overall frame dimensions. For example, the software can determine walls defined by raked ceilings as explained previously. The frame design software can also accommodate window and door openings into the frame design as well as account for joints with adjacent walls so that stud placement will be present in the correct location to enable correct securement of the cladding to the frames.

The program can also automatically design appropriate wall-cladding panels for quantity analysis.

Having taken each of these factors into consideration, as well as engineering and user specified requirements, the frame design package designs the components of the frame and produces a plan of the frame. See for example the plan of the frame illustrated in FIG. 9. In this view, the plan only indicates a solid line for each structural member and does not indicate the 3-dimensional shape of each structural member, given that each structural member will be a channel section. However, the plan does specify the orientation of each structural member. This is important for the member design software to design each of the individual structural members as will be discussed in connection with FIGS. 11 to 13. The bottom step in the flow chart of FIG. 8 indicates those elements which are generated for each of the various frame types. For example, in wall frames, the frame design software generates a plan view of the top and bottom plates, the spaced studs, the nogs extending between adjacent studs and the lintel structures. Members of each of these types can be viewed in FIG. 9.

Figure 9:
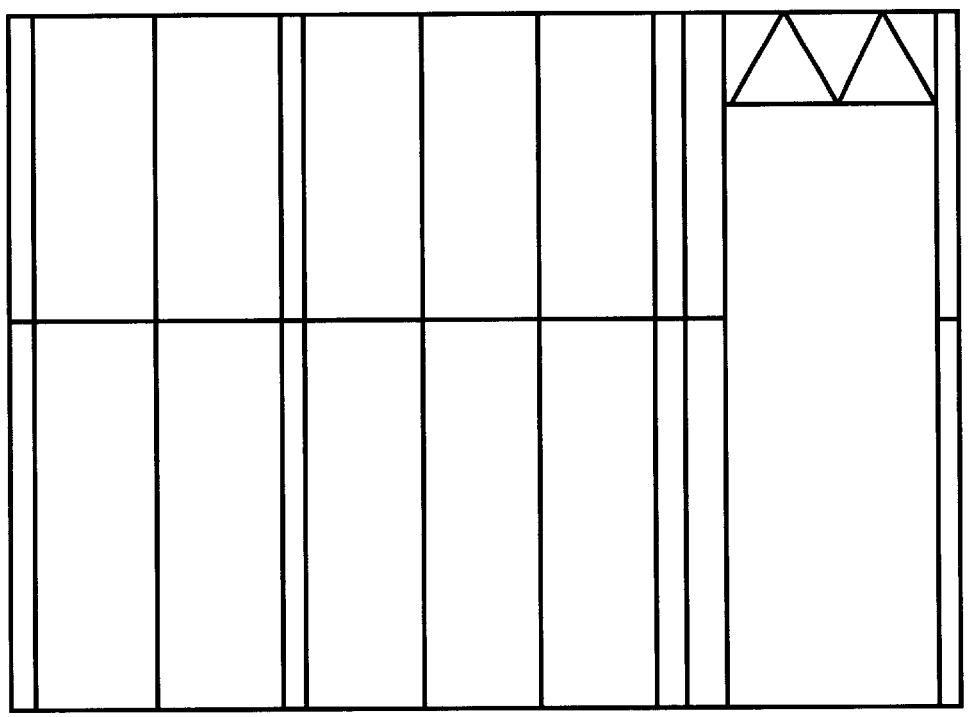
FIG. 9 is a side view of a computer designed wall frame.
Figure 10:
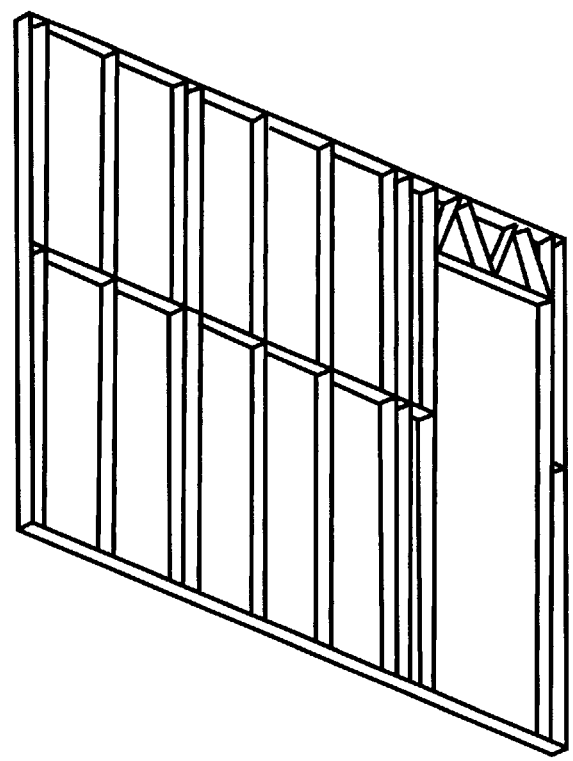
FIG. 10 is a perspective view of the frame illustrated in FIG. 9.

FIG. 9 is representative of the initial output to the user to enable the user to inspect the frame so designed and edit if required. The frame illustrated in FIG. 9 corresponds to the wall panel between points A and B shown on FIG. 6. The user also has the option of viewing the frame in pseudo-perspective as illustrated in FIG. 10 (the precise channel shape is not indicated here).

Once a particular frame has been designed, the user moves on to the next frame and so on until all of the frames have been designed by the frame design software.

Member Design Software

Once all the frames have been designed, the frame plan information is exported to the member design software for design of each individual structural member. This is more complicated than first apparent as will be understood in connection with an explanation of a possible design scenario of a wall frame illustrated in FIG. 11. The wall frame 40 includes inclined top plate 42, bottom plate 44, parallel spaced studs 46, nogs 48 and door head 50. Each solid line of the plan information represents the web 11 of a particular channel section. The orientation of each channel section is included in the plan although it is not indicated in FIG. 11.

As previously mentioned the orientation of the various structural members will be important in assessing how the structural members interrelate to each other to determine their design features. For example, FIG. 12 schematically illustrates the junction between the two studs 46 above the door opening and their interconnection with top plate 42. The thick line for each of the structural members indicates the web 11 of the channel sections. Given that the top plate 42 is orientated with the channel opening towards the studs 46, the joint between the top plate 42 and the studs 46 will be of the type illustrated in FIG. 2c. The member design software therefore specifies that the top plate 42 is to be formed with flattened edge portions in the region where the studs 46 intersect with the top plate 42.

Figure 12:
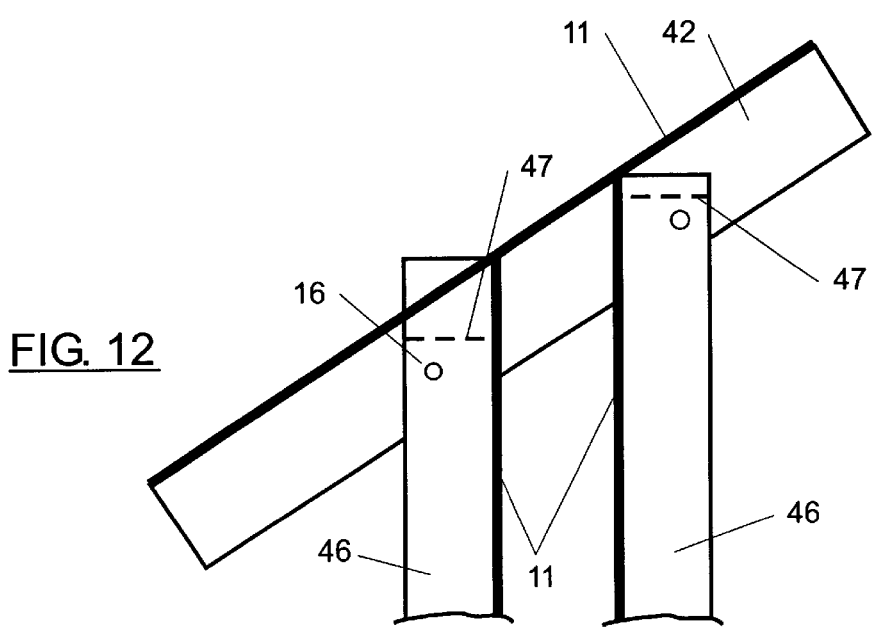
FIG. 12 is a side view of certain detail of the wall frame illustrated in FIG. 11.

The webs of each structural member are illustrated by the thick solid line in FIG. 12. From FIG. 12 it can be seen that if the studs 46 were extended to the intersection between the web of the stud 46 and the web of the intersecting top plate 42, the members so formed would not actually fit together. Given that the ends of the studs 46 cannot extend beyond the web 11 of the top plate 42, the length of the studs 46 must be adjusted accordingly and moreover, further reduced a short distance to allow for correct jointing. The adjusted or actual lengths for studs 46 are denoted by dashed lines 7.

The rivet hole position 16 which must align in both the top plate 42 and the stud 46 is located to lie a predetermined distance from both the web 11 of the top plate 42 and the web 11 of the stud 46. The position of the hole 16 can therefore be determined for each member 42, 46. Preferably, the member design software is provided on the roll forming machine which produces the structural members. Thus, in the event that the location of the rivet punch is adjustable, feedback will be provided to the member design software to locate the rivet hole 16 a distance from each of the webs 11 corresponding to the distance that the rivet hole punch is located from the web as the web moves through the roll forming machine.

Figure 13:
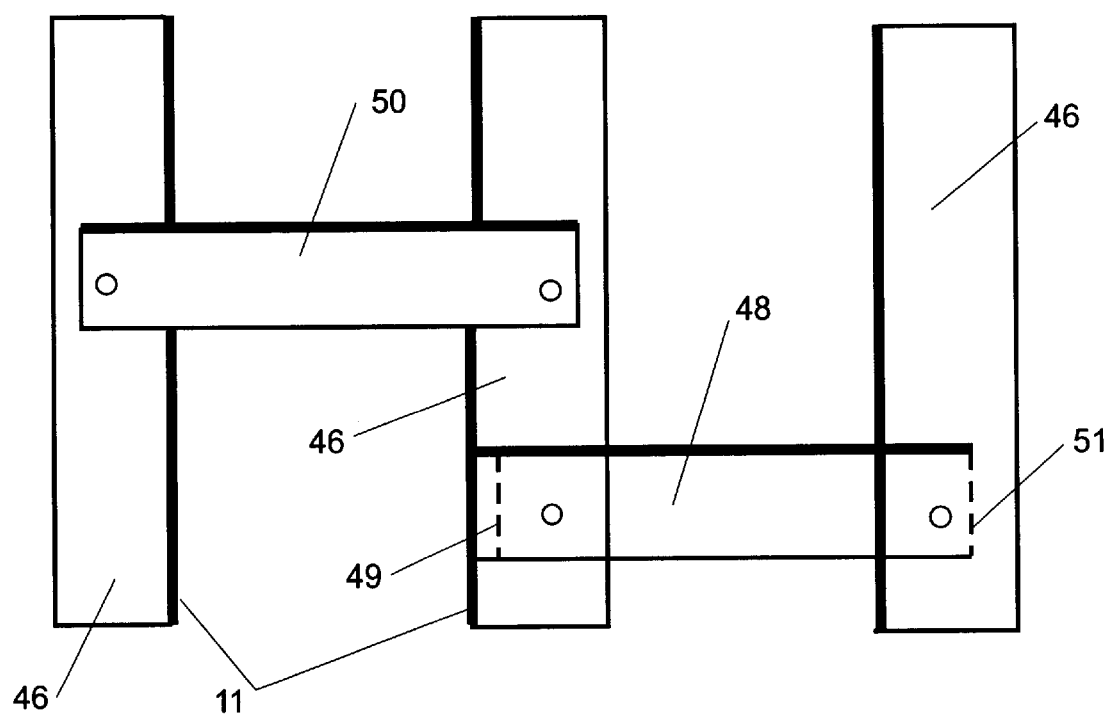
FIG. 13 is a side view of other detail of the wall frame illustrated in FIG. 11.

From FIG. 13, it can be seen that the two studs 46 on either side of the door opening have their webs 11 arranged back to back. The door head member 50 will thus require notch type joints of the type previously illustrated in FIG. 2b. Notches are thereby formed in the ends of door head member 50 enabling the studs 46 to be received in the notches at each end of the door head member 50. It will be understood that the door head member 50 is also extended beyond the studs 46 from its original plan length terminating at the web-web intersection. Generally speaking, members which form notched junctions are extended past their original design length whereas members which are received in open faced channels are reduced from their original design length to fit within the channels. Additionally, the ends of the door head 50 will have the strengthening folds flattened out to more easily accommodate the studs 46 within the notches.

The nog 48 illustrated in FIG. 13 is arranged between an open-channelled upright stud 46 and an upright stud 46 presenting the web 11 towards the nog 48. The nog 48 will therefore be trimmed at the left hand side, as identified by dashed line 49, to be received within the left hand upright stud 46 whereas the right end of the nog 48 will be extended and notched, as identified by dashed line 51, to receive the right hand stud 46.

Figure 14:
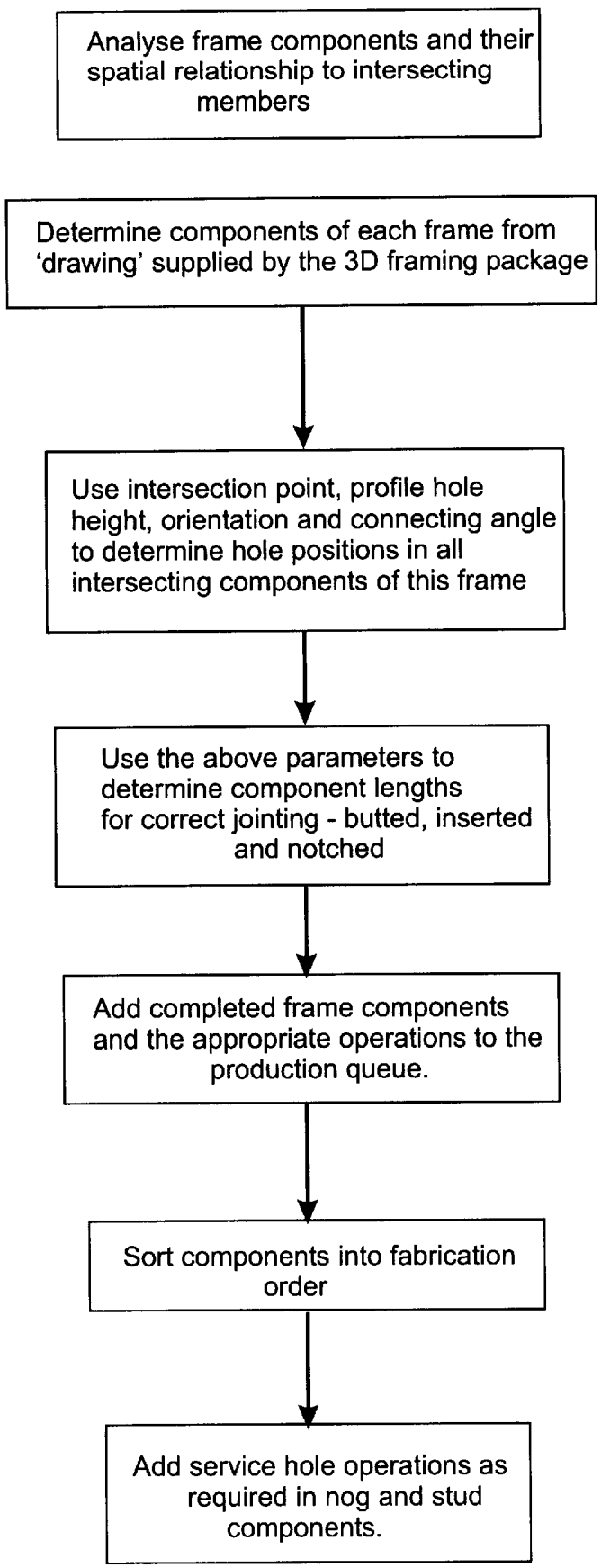
FIG. 14 is a flowchart of the process of analysis for each structural member in a frame, to design each structural member of the frame.

All of the structural members for all of the frames are designed in this manner by the member design software. A flowchart of the process is illustrated in FIG. 14.

Roll Former

Figure 15:
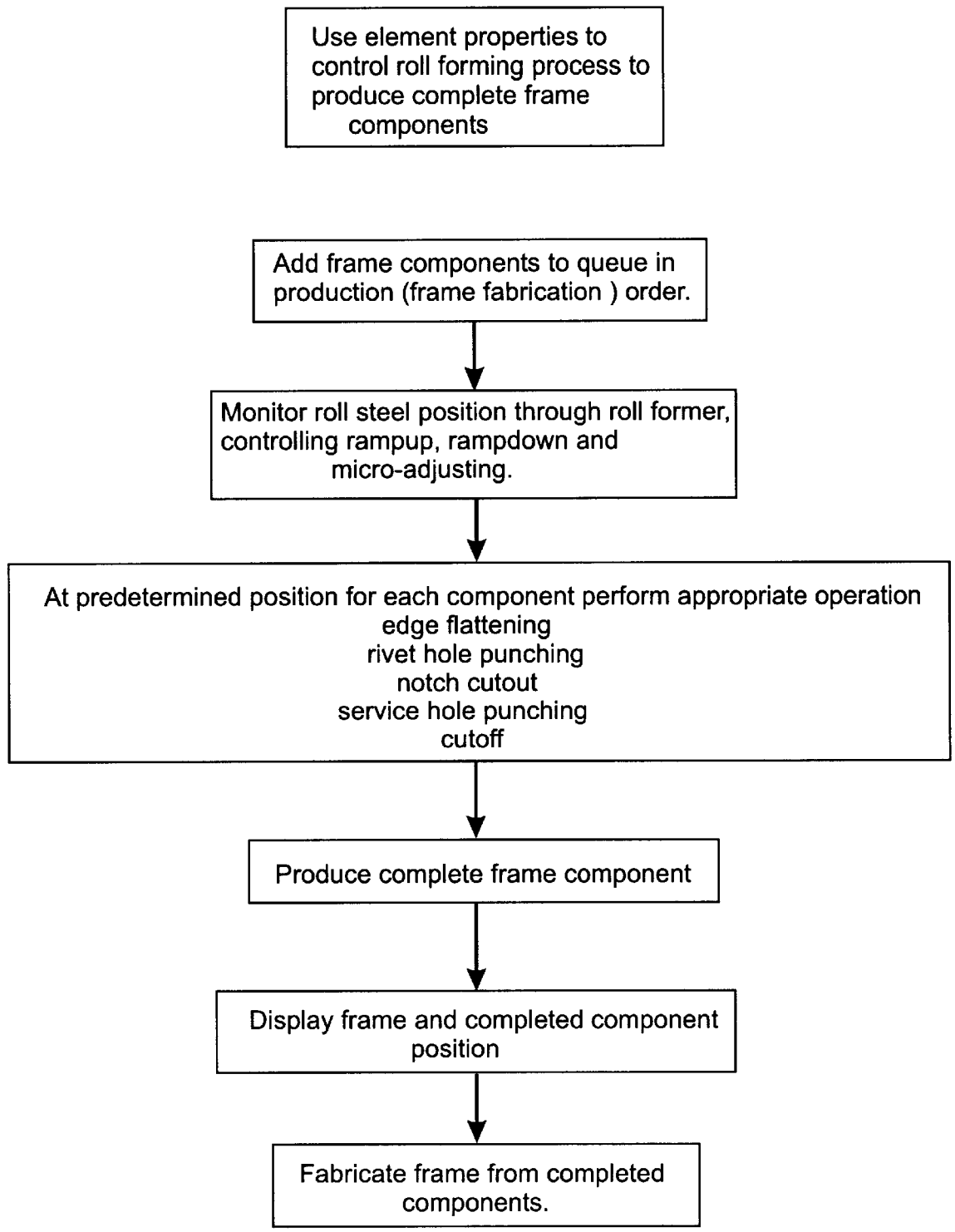
FIG. 15 is a flowchart of the process for producing the structural members by roll forming, the process being under computer control.

FIG. 15 illustrates a flow chart for the computer controlled roll forming process. Firstly, a frame fabrication order is determined. For example, firstly, the top plate and bottom plate are produced, then the stud members from left to right, interspersed by the nogs in order that assembly and riveting of the frame may commence as soon as the structural members roll off the roll former. Thus, once all the structural member specifications for a particular frame have been determined, their production order is determined. The member specifications are then used to generate operational instructions for the roll forming machine to fabricate the structural members.

FIG. 16 schematically indicates the components of a typical roll forming machine which might be used to implement the present invention. The engineering technology required to construct a roll forming machine will be known to those skilled in the field of roll forming and extensive details will not be provided here. Metal strip 140 is unwound from a reel 141 as indicated, through alignment plates 142. Lipping rollers 143 form the edges 14 indicated in FIG. 2a. Four sets of channel bending rollers 144 create arms 12 on the strip 140 although these are not shown in FIG. 4 for the purposes of clarity. Corner sharpening rollers 145 finish the right angles between web 11 and arms 12.

Figure 1B:
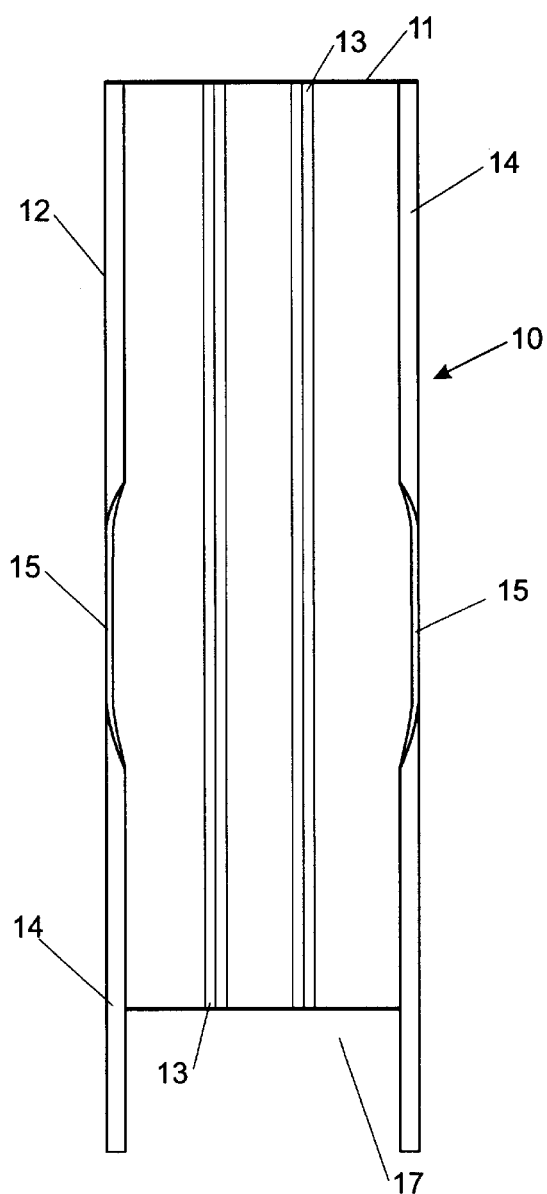
Figure 1C:
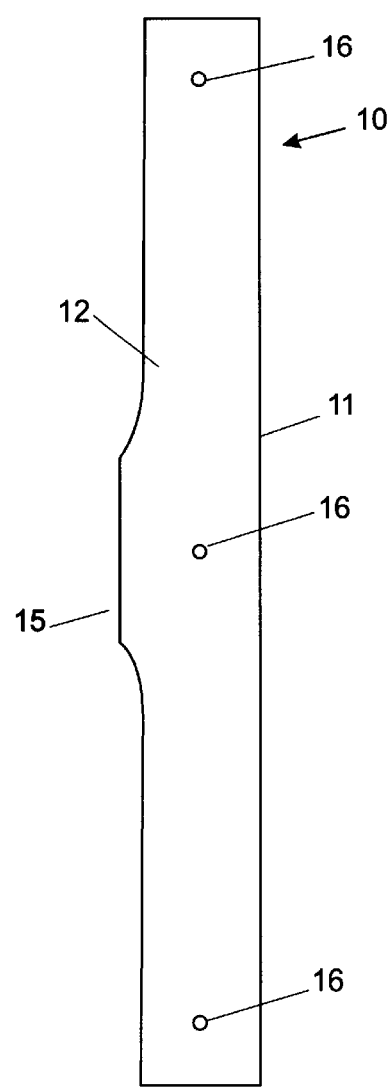

Rib forming rollers 146 create the strengthening ribs 13 shown in FIG. 1b. Pneumatic punches 147 create holes 16 in arms 12 where required. Notching rollers 148 effectively punch holes in web 11 at appropriate points to create notches 17 at the ends of members as required. The members are eventually cut by a guillotine 150.

The roll forming machinery is under computer control as indicated by computer 151. In this embodiment, the computer also carries out the functions of the member design software as well as creating the operational instructions and determining the sequence of operations for the roll forming machine. A rotary length encoder 152 monitors the length of stock material which has passed through the equipment during a given forming process. A motor which drives each of the rollers 143–146 and 148 is turned on or off by the computer 151 through controller 153 in response to the sequence of operational instructions. Position sensors 154 determine the state of guillotine 150. Air valve solenoids 155 operate the corner forming rollers 145, notching rollers 149 and punches 147.

It will be understood that the roll forming machine may be operating on several of the structural members at any one time, depending on the lengths of the various members to be produced and the operational length of the roll forming machine. The sequence of operational instructions is therefore determined in real time according to the number of members being fabricated by the roll former at any one time and the next closest position of any tool to a required portion of the member requiring that operation.

As indicated in FIG. 15, the roll former control software monitors the steel position through the various rolls and forming stations. Knowing the distance that the sheet steel needs to move between the last performed operation to the next determined operation, the control software dynamically determines acceleration and deceleration parameters for the machine rollers to provide a best-guess method to move the sheet steel to the appropriate next position, in the least time. This is referred to as "ramp up" and "ramp down". Given that the method is a "best-guess" method the control software determines the difference between the intended location and the actual location through the use of position sensors to determine the micro-adjustment necessary to move the steel sheet to the correct location for the next operation. Alternatively the positioning could be done with a servo motor and drive, under the control of the roll-former micro-computer. Either an external encoder is used by the micro-computer to command the servo drive to accurately position the steel or the external encoder is used to commutate the servo drive directly to its correct position.

As indicated in the flow chart in FIG. 15, the steel sheet is moved to the appropriate location to perform any of the following operations: edge flattening, rivet hole punching, notch cut out, service hole punching and cut off by guillotine action.

Figure 17:
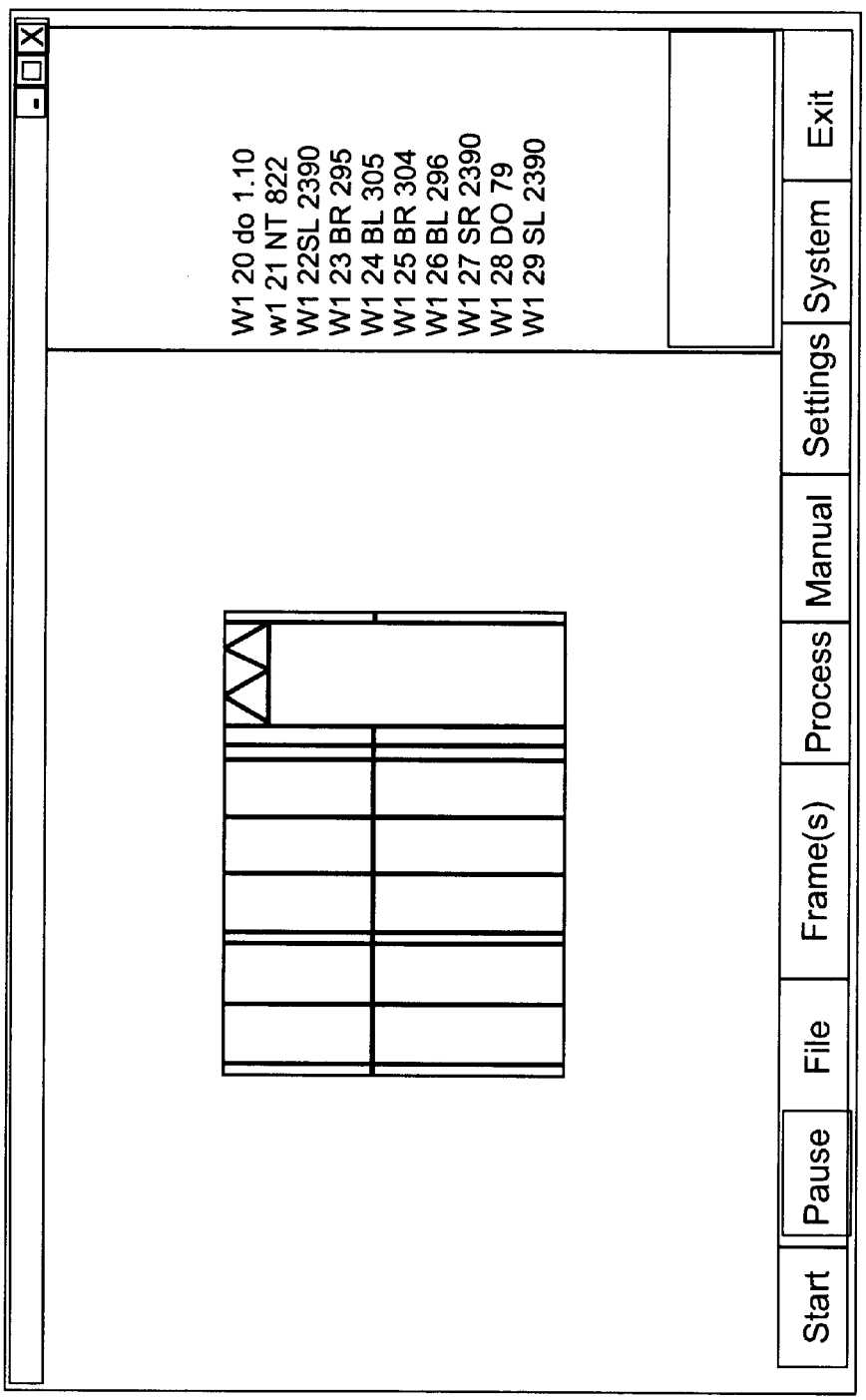
FIG. 17 is a view from the screen of the computer controlling the operation of the roll forming machine.

The completed structural member is highlighted in an overall view of the frame being constructed. For example, a typical output of the roll former computer control screen is indicated in FIG. 17. The various structural members are highlighted as they are produced by the roll former. The hard lines and the narrower lines are indicative of the channel orientation, thereby providing guidance on site to the workers constructing the frame.

Figure 18:
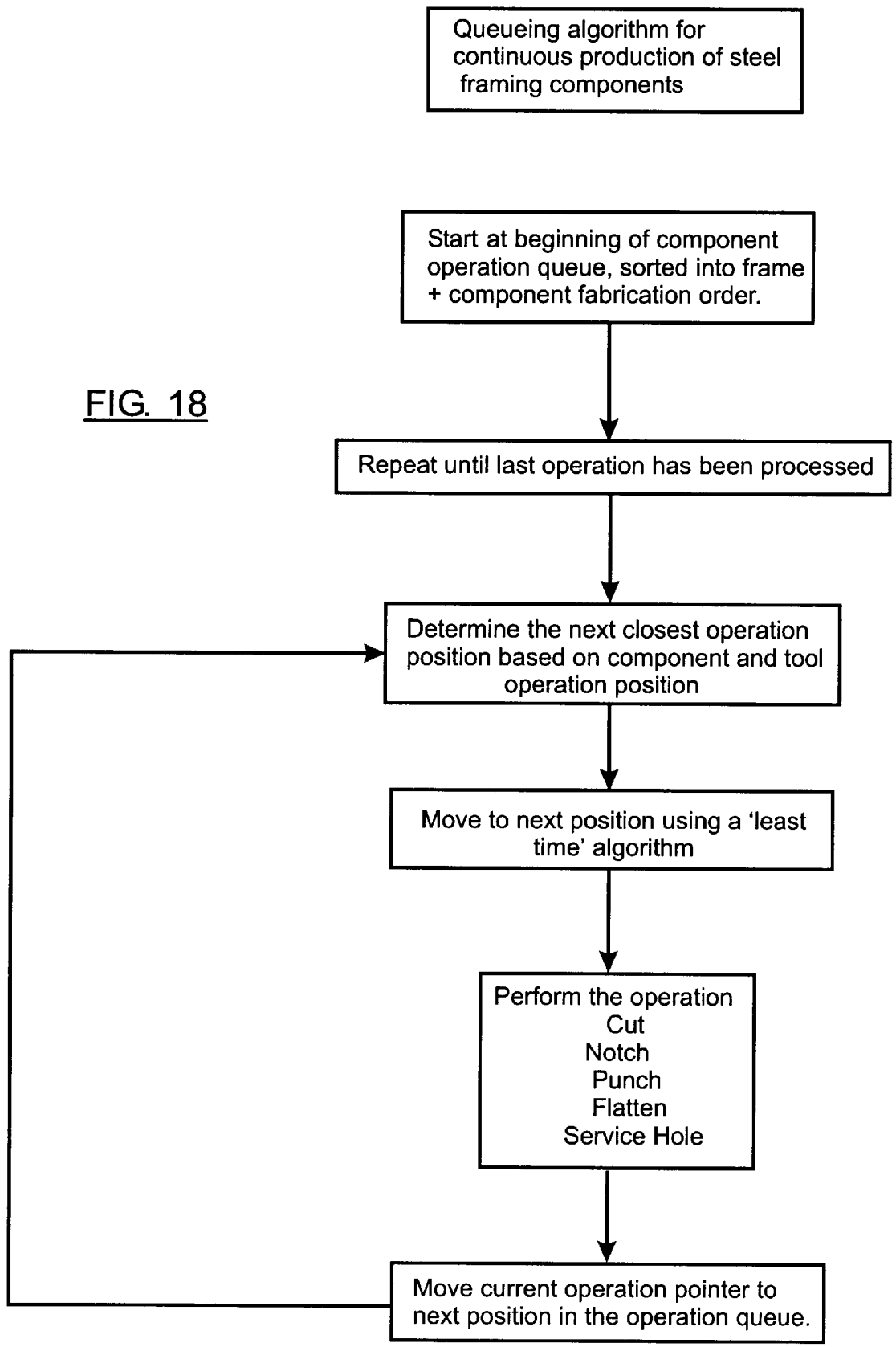
FIG. 18 is a flowchart of the queuing algorithm that determines the order of operations on the roll forming machine.

FIG. 18 is a flow chart of the queuing algorithm to determine the order in which the various operations are to be performed on the structural members being processed by the roll forming machine. Given that some of the structural members are quite short, several structural members may simultaneously be in production on the roll former.

In the queuing algorithm, initially the structural members are sorted into production order as previously explained and their operations identified. During production, the next closest operation in relation to the appropriate tool is determined. The steel sheet is then moved to this position using the "least time" algorithm previously explained. The required operation is then performed on the sheet steel, following which the next closest operation is determined.

The foregoing describes only one embodiment of the present invention and modifications may be made thereto without departing from the scope of the present invention.

What is claimed is:

1. A method of designing, by a computer, a building frame having a number of structural members of which at least some are intersecting structural members, the method comprising:

causing to be stored, a predetermined plan of the layout and orientation of the structural members in the frame including a design length for each of the structural members; and selecting a joint type from a plurality of different joint types for each intersection of the intersecting structural members and analysing the stored predetermined plan to derive specifications of actual lengths and jointing details for the structural members to enable the structural members made according to specification to fit together to form the frame, whereby the actual length for each intersecting structural member is variable from the design length depending on the selected joint types.

2. The method as claimed in claim 1 wherein each of the structural members in the predetermined plan is modelled as a basic element and the analysis is conducted by converting the basic elements to 3-dimensional section shapes according to the orientation prescribed by the predetermined plan, and further by spatial analysis, calculating actual lengths which enable the structural members to fit together.

3. The method as claimed in claim 2 wherein the 3-dimensional section shape is predefined.

4. The method as claimed in claim 2 wherein the basic elements are converted to a 3-dimensional shape which is common to all the basic elements.

5. The method as claimed in claim 1 wherein the method includes inputting a hole locus relative to a section locus, the jointing details for each structural member including a hole aligned with a hole on an intersecting structural member, the location of each hole being calculated by ascertaining the intersection of the hole locus on one structural member with the hole locus on the intersecting structural member.

6. The method as claimed in claim 5 when conducted on a forming machine for forming the structural members, wherein the hole locus is input from feedback provided by the forming machine.

7. The method as claimed in claim 2 wherein the 3-dimensional section shape is a channel having a web and two arms defining an open side between the two arms.

8. The method as claimed in claim 7 wherein the plurality of different joint types include:

a notched junction whereby a first channel intersects with a second channel with the first channel having its open side facing away from the second channel with the second channel having a notch formed in the web; and a forward junction whereby a third channel is received in the open side of a fourth channel, wherein for each notched junction, the analysis engine extends the design length of the second channel to derive the actual length and wherein for each forward junction, the analysis engine shortens the design length of the third channel to derive the actual length.

9. A method of fabricating a building frame having a number of structural members of which at least some are intersecting structural members, the method comprising designing, on a computer, the building frame according to the following:

causing to be stored, a predetermined plan of the layout and orientation of the structural members in the frame including a design length for each of the structural members;

selecting a joint type from a plurality of different joint types for each intersection of the intersecting structural members and analysing the stored predetermined plan to derive specifications of actual lengths and jointing details for the structural members to enable the structural members made according to specification to fit together to form the frame, whereby the actual length for each intersecting structural member is variable from the design length depending on the selected joint types;

forming the structural members on a forming machine according to the specifications; and assembling the structural members according to the predetermined plan.

10. The method as claimed in claim 9 wherein all the structural members are formed with a common section.

11. The method as claimed in claim 9 further including the step of controlling, by computer, the operations of the forming machine that being the same computer as the computer used for designing the building frame.

12. The method as claimed in claim 9 wherein the structural members are formed on the site where the structural members are assembled.

13. The method as claimed in claim 9 wherein the structural members are formed by the use of a portable roll forming machine.

* * * * *